United States Patent
Hishinuma et al.

(10) Patent No.: US 10,766,258 B2
(45) Date of Patent: *Sep. 8, 2020

(54) PIEZOELECTRIC DEVICE AND METHOD FOR MANUFACTURING AN INKJET HEAD

(71) Applicant: FUJIFILM DIMATIX, INC., Lebanon, NH (US)

(72) Inventors: Yoshikazu Hishinuma, Hadano (JP); Shinya Sugimoto, Tokyo (JP); Youming Li, San Jose, CA (US); Christoph Menzel, New London, NH (US); Mats G. Ottoson, Saltsjo-Boo (SE); Darren Imai, Los Gatos, CA (US)

(73) Assignee: FUJIFILM DIMATIX, INC., Lebanon, NH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/573,470

(22) Filed: Sep. 17, 2019

(65) Prior Publication Data

US 2020/0009865 A1    Jan. 9, 2020

Related U.S. Application Data

(62) Division of application No. 15/630,590, filed on Jun. 22, 2017, now Pat. No. 10,442,195.

(51) Int. Cl.
*B41J 2/14* (2006.01)
*B41J 2/145* (2006.01)
(Continued)

(52) U.S. Cl.
CPC ........... *B41J 2/14201* (2013.01); *B41J 2/145* (2013.01); *B41J 2/14233* (2013.01); *B41J 2/161* (2013.01);
(Continued)

(58) Field of Classification Search
CPC ...... B41J 2/14233; B41J 2/145; B41J 2/1607; B41J 2/161; B41J 2/1628; B41J 2/1631; B41J 2/1642; B41J 2/14201
See application file for complete search history.

(56) References Cited

U.S. PATENT DOCUMENTS

| 6,262,946 B1 | 7/2001 | Khuri-Yakub et al. |
| 8,833,909 B2 | 9/2014 | Nishitani ............... B41J 2/1404 347/62 |

(Continued)

FOREIGN PATENT DOCUMENTS

JP    2008118168    5/2008

OTHER PUBLICATIONS

International Search Report and Written Opinion, dated Sep. 19, 2018, (7 pages).

(Continued)

*Primary Examiner* — Lamson D Nguyen
(74) *Attorney, Agent, or Firm* — Womble Bond Dickinson (US) LLP

(57) ABSTRACT

A piezoelectric device and method of manufacturing the same and an inkjet head are described. In one embodiment, the inkjet print head comprises a plurality of jets, wherein each of the plurality of jets comprises a nozzle, a pressure chamber connected with the nozzle, a piezoelectric body coupled to the pressure chamber, and an electrode coupled to the piezoelectric body to cause displacement of the piezoelectric body to apply pressure to the pressure chamber in response to a voltage applied to the electrode; and wherein electrodes of two or more of the plurality of jets have different sizes to cause their associated piezoelectric bodies to have a uniform displacement amount when the voltage is applied to the electrodes.

20 Claims, 24 Drawing Sheets

(51) Int. Cl.
  *B41J 2/16* (2006.01)
  *H01L 41/312* (2013.01)
  *H01L 41/047* (2006.01)
  *H01L 41/293* (2013.01)
  *H01L 41/297* (2013.01)
  *H01L 41/29* (2013.01)

(52) U.S. Cl.
  CPC ........... *B41J 2/1607* (2013.01); *B41J 2/1628* (2013.01); *B41J 2/1631* (2013.01); *B41J 2/1642* (2013.01); *B41J 2/1646* (2013.01); *H01L 41/047* (2013.01); *H01L 41/0472* (2013.01); *H01L 41/29* (2013.01); *H01L 41/293* (2013.01); *H01L 41/297* (2013.01); *H01L 41/312* (2013.01); *B41J 2002/14266* (2013.01); *B41J 2002/14459* (2013.01); *B41J 2002/14491* (2013.01)

(56) References Cited

U.S. PATENT DOCUMENTS

| | | | |
|---|---|---|---|
| 9,090,084 B2 | 7/2015 | Govyadinov | B41J 2/1404 |
| 9,102,154 B2 | 8/2015 | Yokoyama | B41J 2/162 |
| 10,442,195 B2 * | 10/2019 | Hishinuma | B41J 2/1642 |
| 2006/0012644 A1 | 1/2006 | Yasui | |
| 2008/0013405 A1 | 1/2008 | Moon et al. | |
| 2008/0100676 A1 | 5/2008 | Sakaida | |
| 2008/0239018 A1 | 10/2008 | Sekiguchi | |
| 2014/0240404 A1 | 8/2014 | Li et al. | |

OTHER PUBLICATIONS

Korean Office Action for Application No. 10-2015-7008587, 15 pages.

International Preliminary Report on Patentability for Application No. PCT/US2018/038762, dated Jan. 2, 2020, 8 pages.

* cited by examiner

| Correction Coefficient | Mask No. | Electrode Width (μm) | Displacement Volume Actual Measured Value (Normalized using No. 1) | Resonant Frequency (Normalized using No. 1) |
|---|---|---|---|---|
| 1.00 | 1 | 46.8 | 1.000 | 1.000 |
| 0.99 | 2 | 45.3 | 0.986 | 1.001 |
| 0.98 | 3 | 43.7 | 0.981 | 1.002 |
| 0.97 | 4 | 41.1 | 0.970 | 1.000 |
| 0.96 | 5 | 39.5 | 0.958 | 1.003 |
| 0.95 | 6 | 37.4 | 0.947 | 1.003 |

FIG. 12

| Correction Coefficient | Mask No. | Distance of Protrusion From Pressure Chamber Wall (μm) | Displacement Volume Actual Measured Value (Normalized using No. 1) | Resonant Frequency (Normalized using No. 1) |
|---|---|---|---|---|
| 1.00 | 1 | 0.0 | 1.000 | 1.000 |
| 0.99 | 2 | 2.0 | 0.990 | 1.001 |
| 0.98 | 3 | 8.8 | 0.979 | 1.003 |
| 0.97 | 4 | 14.6 | 0.970 | 1.005 |
| 0.96 | 5 | 20.0 | 0.961 | 1.008 |
| 0.95 | 6 | 24.8 | 0.949 | 1.011 |

FIG. 17

| Distance from Center (mm) | Film thickness (μm) | Normalization using Minimum Value | Correction Coefficient (Reciprocal) |
|---|---|---|---|
| 0 | 3.10 | 1.076 | 0.929 |
| 20 | 3.04 | 1.056 | 0.947 |
| 30 | 3.00 | 1.042 | 0.960 |
| 40 | 2.94 | 1.021 | 0.979 |
| 50 | 2.88 | 1.000 | 1.00 |

FIG. 20

| Die # | Zone # | Distance from Center | Correction Coefficient (Reciprocal) |
|---|---|---|---|
| 4 | 1 | 45.7 | 0.991 |
|   | 2 | 35.9 | 0.971 |
|   | 3 | 26.2 | 0.955 |
|   | 4 | 17.0 | 0.943 |
| 5 | 1 | 17.0 | 0.943 |
|   | 2 | 26.2 | 0.955 |
|   | ...... | ...... | ...... |

FIG. 21

PIEZOELECTRIC DEVICE AND METHOD FOR MANUFACTURING AN INKJET HEAD

RELATED APPLICATION

The present application is a divisional of and claims the benefit of U.S. patent application Ser. No. 15/630,590, filed on Jun. 22, 2017, entitled "A PIEZOELECTRIC DEVICE AND METHOD FOR MANUFACTURING AN INKJET HEAD", which claims the benefit and is incorporated by reference in its entirety.

FIELD OF THE INVENTION

Embodiments of the present invention relate to the field of printers; more particularly, embodiments of the present invention relate to a piezoelectric device and an inkjet head that produces uniform discharge droplet volumes from a plurality of nozzles.

BACKGROUND OF THE INVENTION

An inkjet recording device that discharges ink from multiple nozzles of an inkjet head to record an image on a recording medium is well known. For example, an actuator type inkjet head where a piezo actuator that transforms when voltage is applied is placed in each pressure chamber that connects to a nozzle is well known as an inkjet head. This inkjet head is manufactured using a semiconductor process where pressure chambers, and piezo actuators corresponding respectively to the pressure chambers, are arranged on a silicon wafer.

One problem with this type of inkjet head in that when discharge droplet volumes from the nozzles are not uniform, concentration distribution occurs in an output image and thus image quality drops. To address this problem, measures are taken to correct variations in ink discharge droplet volumes.

For example, a technique to address this problem includes measuring the thickness of a piezoelectric body film, determining widths for individual electrodes based on the amount of deviation between the thickness of the measured piezoelectric body film and a preset reference thickness, and then forming individual electrodes having the determined widths to then correcting variations in the thickness of the piezo electric body film using the widths of the individual electrodes.

Furthermore, another solution to this problem includes forming a cutout portion to reduce an area of a common electrode, placed on an ink pressure chamber corresponding to a nozzle targeted for a discharge rate adjustment, to correspond to a rate adjustment amount to reduce the transformation amount of a piezo electric element in that region, and thus make an ink discharge rate uniform.

The two solutions described above require measurements of variations in the thickness of a piezoelectric body film relative to individual elements and of an ink discharge rate, and thus the correction processes thereof are complex. Additionally, there is also a lack of any technical concept for changing a position of an inflection point of a displacement profile of a piezoelectric element.

SUMMARY OF THE INVENTION

A piezoelectric device and method of manufacturing the same and an inkjet head are described. In one embodiment, the inkjet print head comprises a plurality of jets, wherein each of the plurality of jets comprises a nozzle, a pressure chamber connected with the nozzle, a piezoelectric body coupled to the pressure chamber, and an electrode coupled to the piezoelectric body to cause displacement of the piezoelectric body to apply pressure to the pressure chamber in response to a voltage applied to the electrode; and wherein electrodes of two or more of the plurality of jets have different sizes to cause their associated piezoelectric bodies to have a uniform displacement amount when the voltage is applied to the electrodes.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 12 is a diagram illustrating one embodiment of masks of correction coefficients and the ring widths thereof.

FIG. 17 is a diagram illustrating one embodiment of masks of the correction coefficients and the protruding amounts thereof.

FIG. 20 is a diagram illustrating one embodiment of the relationships between correction coefficients and distances from a center of a silicon wafer.

FIG. 21 illustrates correction coefficients and distances from a center of a silicon wafer for each zone (excerpt) of an inkjet head die.

DETAILED DESCRIPTION OF THE PRESENT INVENTION

Figure 1:
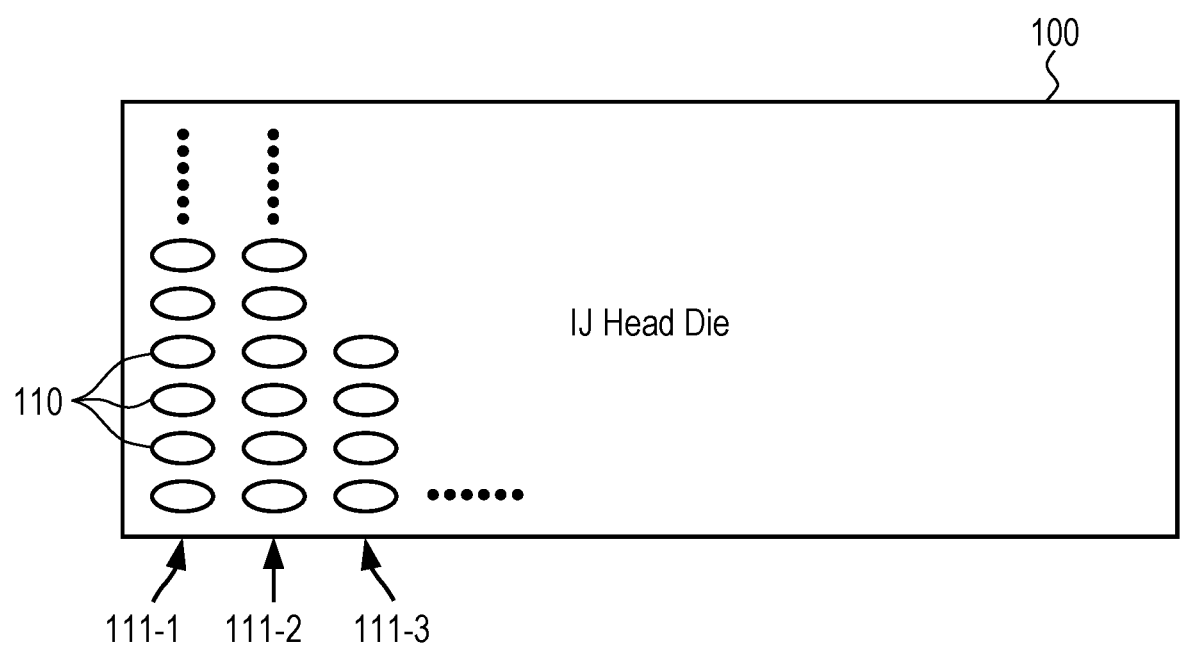
FIG. 1 is a diagram schematically illustrating a configuration of one embodiment of an inkjet head die.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

An inkjet print head is disclosed that comprises a plurality of jets, wherein each of the plurality of jets comprises a nozzle, a pressure chamber connected with the nozzle, a piezoelectric body coupled to the pressure chamber, and an electrode (e.g., a ring-shaped electrode) coupled to the piezoelectric body to cause displacement of the piezoelectric body to apply pressure to the pressure chamber in response to a voltage applied to the electrode. In one embodiment, electrodes of two or more of the jets have different sizes (e.g., different widths) to cause their associated piezoelectric bodies to have a uniform displacement amount when the voltage is applied to the electrodes.

Also disclosed is a method for manufacturing a piezoelectric element and a method for manufacturing an inkjet head that set a position of an inflection point of a displacement profile of a piezo electric element in a suitable position and that make the amounts of displacement of a plurality of piezoelectric elements uniform. In one embodiment, the method for manufacturing a piezoelectric element includes: a piezoelectric body film forming operation for forming a piezoelectric body film on a substrate, a common electrode forming operation for forming a common electrode on one surface of the piezoelectric body film, an individual electrode forming operation for forming a plurality of individual electrodes on the other surface of the piezoelectric body film, and an inflection point setting operation, where each piezoelectric element comprises the common electrode, the piezoelectric body film, and the individual electrodes, for setting positions of inflection points of displacement profiles of the plurality of piezoelectric elements that correspond to the plurality of individual electrodes in positions that correspond to in plane positions of the plurality of piezoelectric elements on the substrate.

In one embodiment, the inflection point of the displacement profile points to where a change in the slope occurs in a cross section displacement curve from positive to negative or vice versa (e.g., the second derivative of the displacement curve changes sign) when the piezoelectric element transforms. One embodiment of a process to find the position thereof, includes measuring a profile of the piezoelectric element during transformation using a scanning laser Doppler meter, differentiating twice in an in-plane direction (in-plane direction of the substrate), and then finding where the profile becomes 0 (zero).

In one embodiment, since the positions of the inflection points of the displacement profiles of the plurality of piezoelectric elements are set in positions that correspond to in-plane positions on the substrate, respectively, the displacement amounts of the plurality of piezoelectric elements are made uniform.

In one embodiment, the individual electrode forming operation forms a ring-shaped individual electrode and that the inflection point setting operation sets a ring width, which is the length in the width direction orthogonal to the circumferential direction of the ring shape, to a width that corresponds to an in plane position on the substrate. This makes the displacement amounts of the plurality of piezoelectric elements uniform.

In one embodiment, the method further include an insulating film forming operation, such that an insulating film is placed between the piezoelectric body film and a portion of the individual electrode, for forming the insulating film that electrically connects the piezoelectric body film and the individual electrode through an opening having a ring shape, and that inflection point setting operation sets a ring width, which is the length in the width direction orthogonal to the circumferential direction of the ring shape, to a width that corresponds to an in plane position on the substrate. This makes the displacement amounts of the plurality of piezoelectric elements uniform.

In one embodiment, the method further include an inflection point adjusting layer forming operation for forming an inflection point adjusting layer on the opposite side of the piezoelectric body film of the individual electrode, and that the inflection point setting operation sets an overlap amount between the individual electrode and the inflection point adjusting layer to an overlap amount that corresponds to an in-plane position on the substrate. This makes the displacement amounts of the plurality of piezoelectric elements uniform.

In one embodiment, the inflection point setting operation includes a mask selecting operation for selecting a desired exposure mask from among a plurality of exposure masks, and uses the selected exposure masks to set the positions of inflection points of displacement profiles of the plurality of piezoelectric elements in positions that correspond to in-plane positions on the substrate, respectively. This makes the displacement amounts of the plurality of piezoelectric elements properly uniform.

In one embodiment, the substrate be divided into a plurality of dies and that each die be given a plurality of exposure regions through a stepper exposure, and that the inflection point setting operation selects the desired exposure mask for each exposure region. This makes displacement amounts of the plurality of piezoelectric elements uniform for each exposure region of the stepper exposure.

In one embodiment, the inflection point setting operation selects a desired exposure mask to correspond to a precalculated correction coefficient. This makes the displacement amounts of the plurality of piezoelectric elements properly uniform.

In one embodiment, the method further include correction coefficient calculating operation for calculating correction coefficients for each in-plane position on the substrate. This makes the displacement amounts of the plurality of piezoelectric elements properly uniform.

In one embodiment, the correction coefficient calculating operation includes a displacement amount measuring operation for measuring displacement amounts of the plurality of piezoelectric elements for each in plane position on the substrate, normalizing the displacement amounts of the plurality of piezoelectric elements, and then calculating the reciprocals of the normalized values as correction coefficients. This makes the displacement amounts of the plurality of piezoelectric elements properly uniform.

In one embodiment, the correction coefficient calculating operation includes a piezoelectric body film measuring operation for measuring the film thickness of the piezoelectric body film based on distance from a reference point in the plane of the substrate, normalizing the film thickness of the piezoelectric body film of each distance, and then calculating the reciprocals of the normalized values as correction coefficients. This makes the displacement amounts of the plurality of piezoelectric elements uniform in a simple manner.

In one embodiment, the reference point be the center of the substrate. This makes the displacement amounts of the plurality of piezoelectric elements uniform in a simple manner.

In one embodiment, the piezoelectric body film forming operation laminates the piezoelectric body film by a sputtering method. As described in more detail below, laminating the piezoelectric body films by a sputtering method is advantageous.

In another embodiment, a method for manufacturing an inkjet head that includes: a pressure chamber forming operation for forming a plurality of pressure chambers and a flow path that links the plurality of pressure chambers in a substrate; and a piezoelectric element forming operation for forming a plurality of piezoelectric elements that correspond to the plurality of pressure chambers, respectively, where the piezoelectric element forming operation uses a method for manufacturing the piezoelectric elements including: a piezoelectric body film forming operation for forming a piezoelectric body film on the substrate; a common electrode forming operation for forming a common electrode on one surface of the piezoelectric body film; an individual electrode forming operation for forming a plurality of individual electrodes on the other surface of the piezoelectric body film and; an inflection point setting operation for setting positions of inflection points of displacement profiles of the plurality of piezoelectric elements that correspond to each of the plurality of individual electrodes in positions that correspond to each in plane position of the plurality of piezoelectric elements on the substrate, where each piezoelectric element comprises the common electrode, the piezoelectric body film, and the individual electrodes.

In one embodiment, since the positions of the inflection points of the displacement profiles of the plurality of piezoelectric elements are set in positions that correspond to in-plane positions on the substrate, respectively, the displacement amounts of the plurality of piezoelectric elements corresponding to the plurality of pressure chambers, respectively, are made uniform.

In one embodiment, the piezoelectric elements to be displacement driven in a convex manner in a direction opposite to the corresponding pressure chambers. These techniques can be applied relative to piezoelectric elements that drive displacement in this way. Note that the direction opposite to the pressure chambers indicates a direction that increases the volumes of the pressure chambers.

According to one embodiment, the displacement amounts of a plurality of piezoelectric elements are made uniform.

Detailed descriptions of the embodiments of the present invention will be given below in accordance with the attached drawings.

Generation of Variations in Discharge Droplet Volumes of Inkjet Heads

Figure 4A:
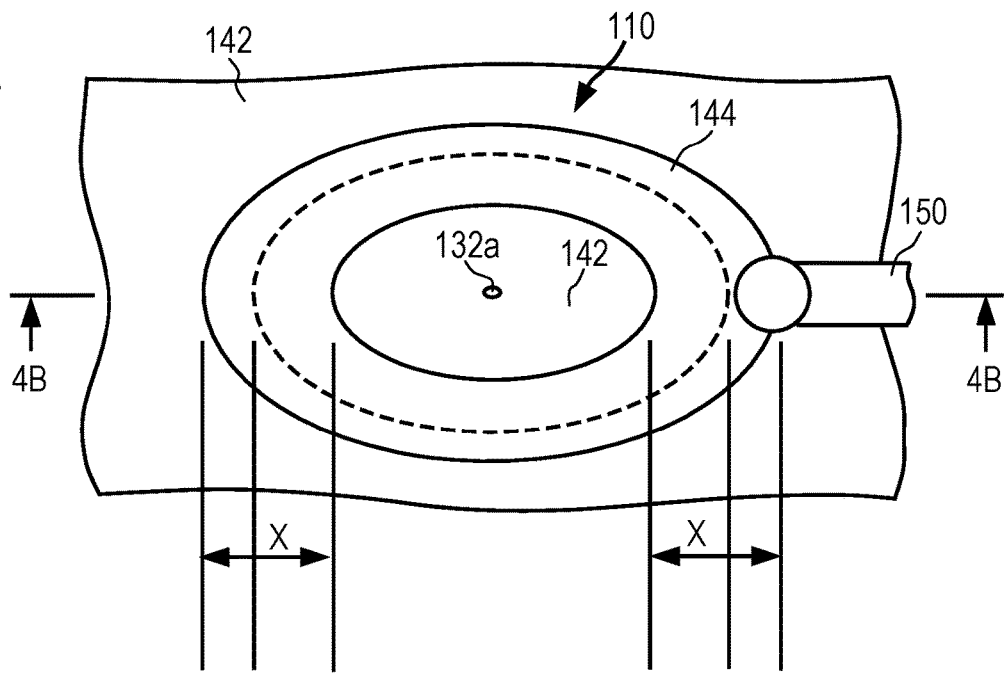
FIGS. 4A-4C are diagrams illustrating one embodiment of a piezo actuator.
Figure 4B:
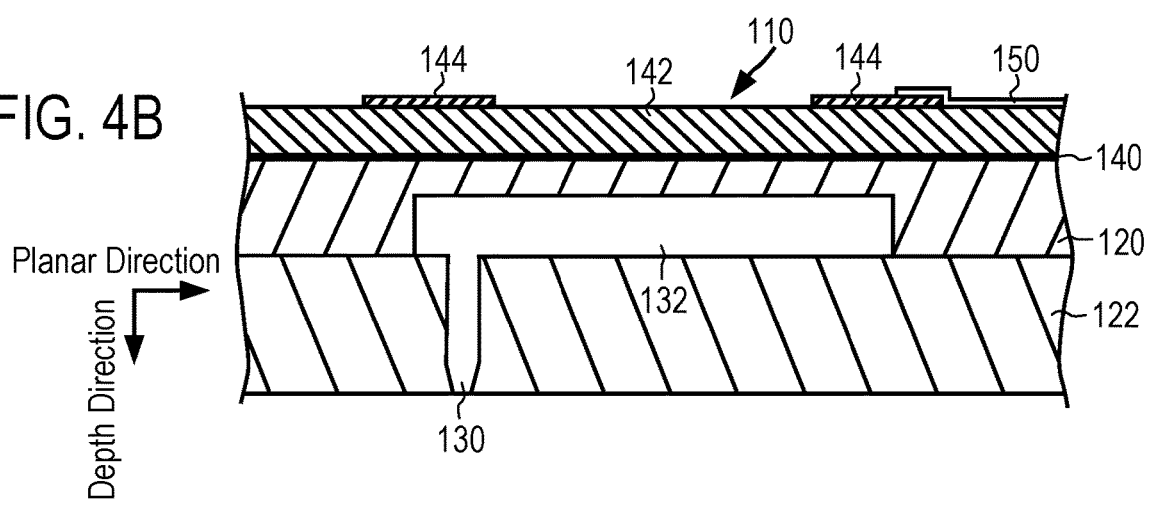

FIG. 1 illustrates one embodiment of an inkjet head die. Referring to FIG. 1, an inkjet head die 100 includes a plurality of piezo actuators 110 (one example of a piezoelectric element) arranged two dimensionally to correspond to the positions of a plurality of pressure chambers 132 (see FIGS. 4A-4C). Piezo actuator columns 111-1 to 111-3 are in the vertical direction and each contains a plurality of piezo actuators 110.

In one embodiment, the plurality of piezo actuators 110 are pressure generating elements for discharging ink inside the plurality of pressure chambers 132 through each of the nozzles 130 (see FIGS. 4A-4B) in communication with the plurality of pressure chambers.

Figure 2:
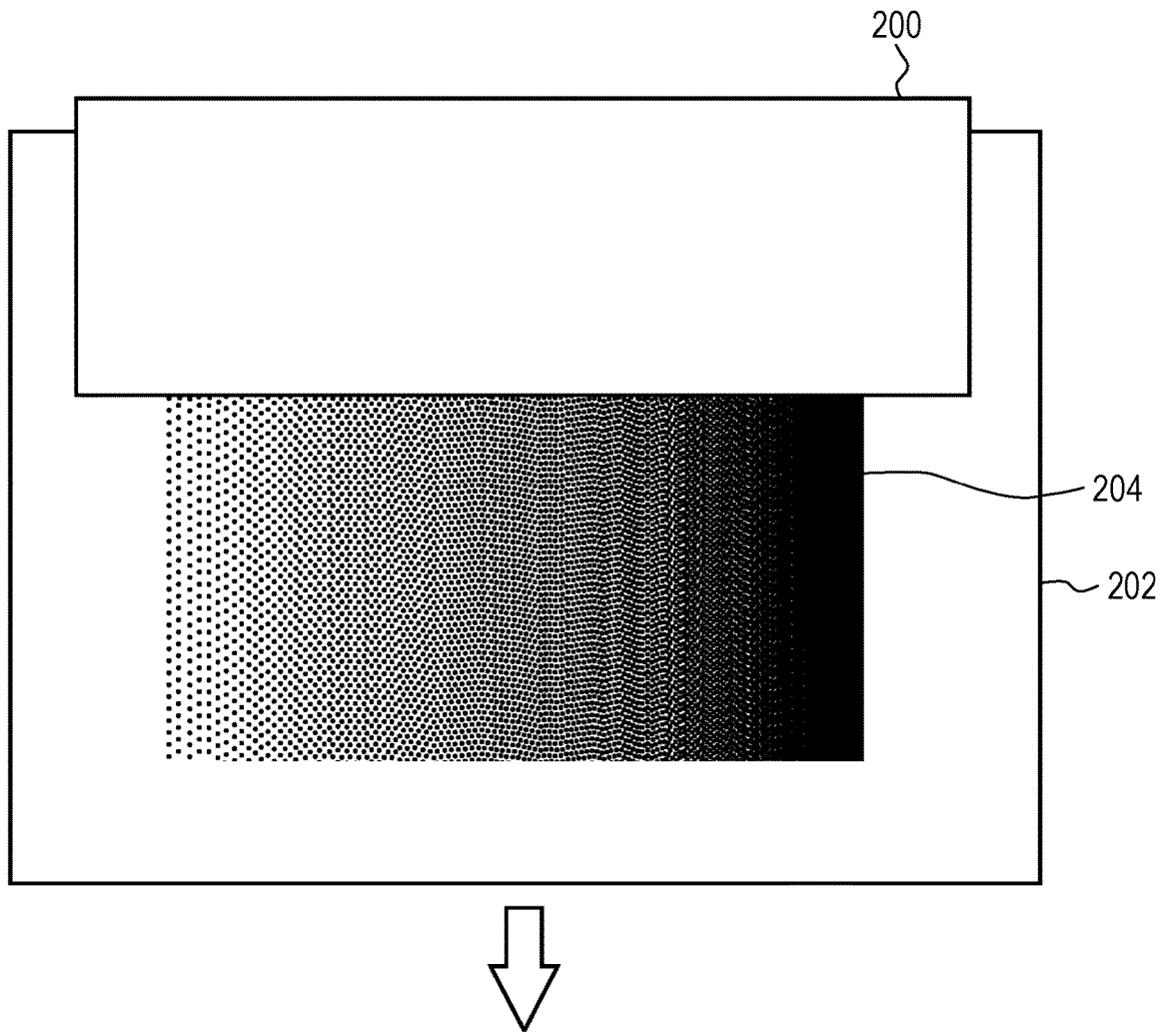
FIG. 2 illustrates an aspect where input image data with uniform concentration is output to a form by an inkjet head.
Figure 2:
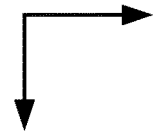

FIG. 2 illustrates an inkjet head outputting image data. Referring to FIG. 2, in one embodiment, inkjet head 200 illustrated uses inkjet head die 100 of FIG. 1. FIG. 2 illustrates a state where input image data with uniform concentration is output to a form 202 by inkjet head 200, and, in this case, the image is output by a single pass method while form 202 is being transported in a form feeding direction relative to inkjet head 200. As illustrated in FIG. 2, an uneven concentration is being generated in a form feeding orthogonal direction in an output image 204.

Figure 3A:
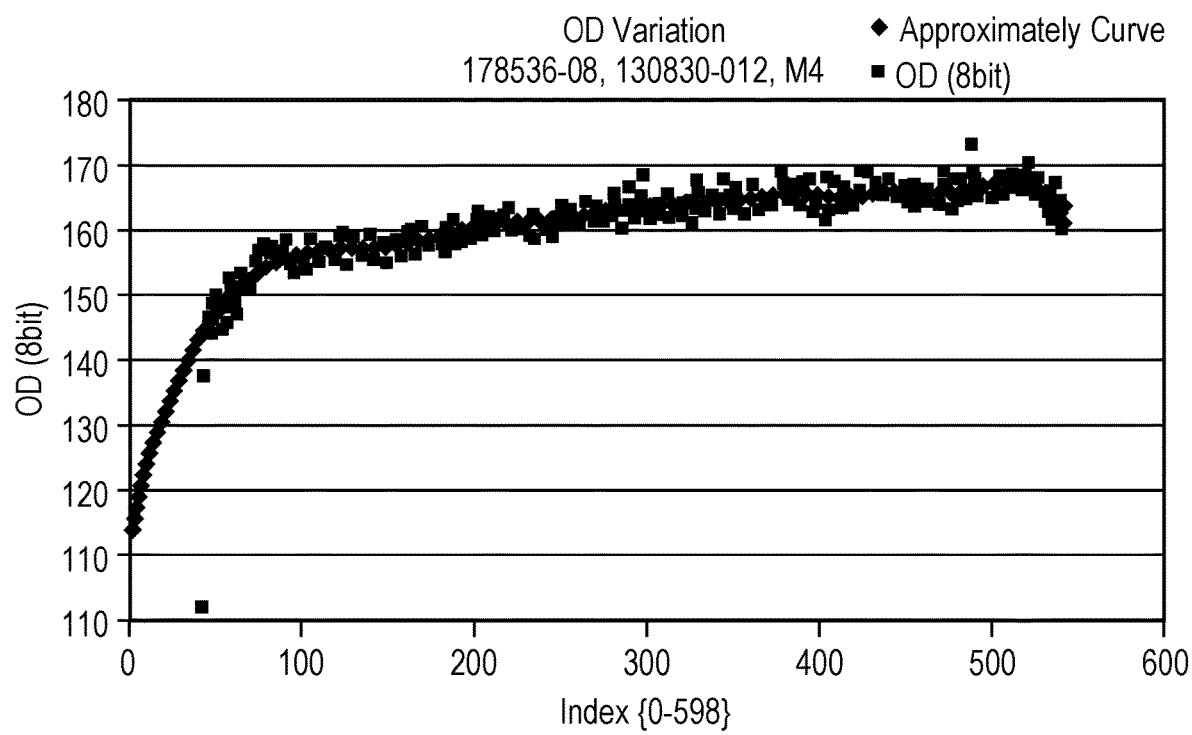
FIGS. 3A-3B are diagrams illustrating a relationship between a concentration distribution of an output image and a displacement amount distribution of a piezo actuator.

FIG. 3A is a graph showing the concentration distribution of the output image where the horizontal axis shows the position in the form feeding orthogonal direction of the output image and the vertical axis shows an Optical Density (OD) value (8 bit) measured from the output image in each position. As illustrated in FIG. 3A, the further the output image is to the right in the form feeding orthogonal direction, the higher the concentration becomes.

Figure 3B:
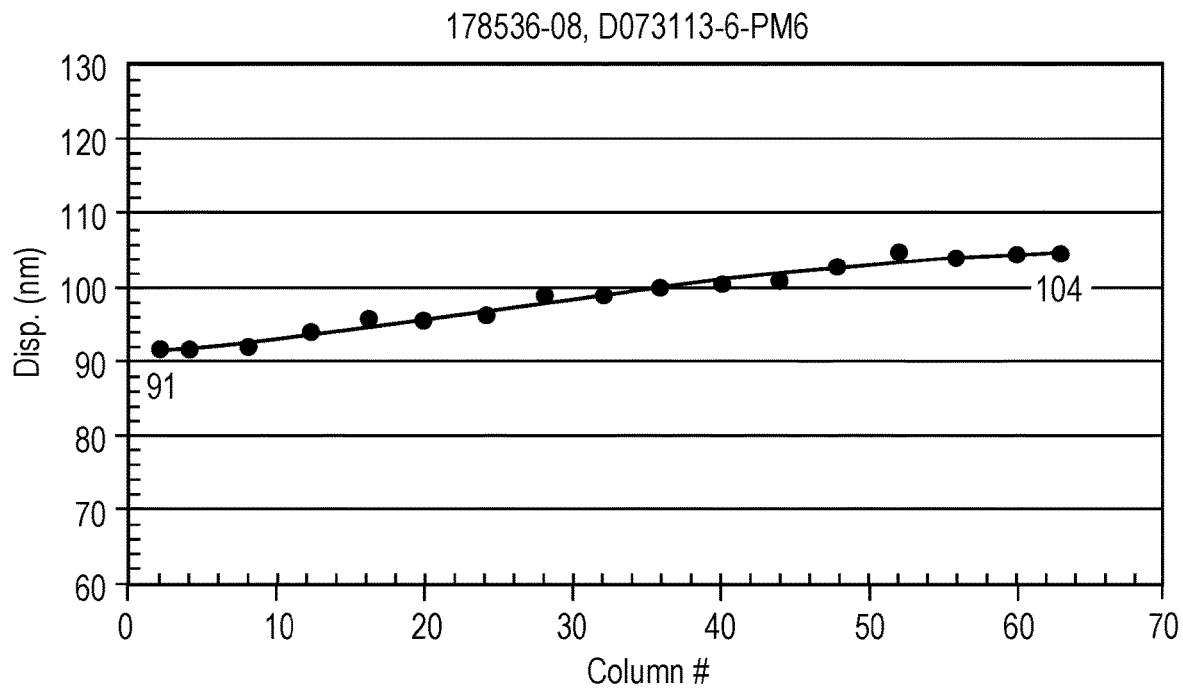

On the other hand, FIG. 3B is a graph showing a displacement amount distribution of piezo actuator 110 provided in inkjet head die 100 of inkjet head 200 where the horizontal axis shows the position of piezo actuator columns 111-$k$ ($k$=1, 2, . . . , n) in the form feeding orthogonal direction and the vertical axis shows the displacement amount (in nanometers) of piezo actuator 110. Here, the average value of the displacement amount of each piezo actuator column 111-$k$ is plotted on the graph.

As illustrated in FIG. 3A and FIG. 3B, the unevenness of the concentration of the output image of inkjet head 200 correlates to the distribution of the displacement amount of piezo actuator 110 of inkjet head die 100. That is, the displacement amount of piezo actuator 110 is distributed in the plane of inkjet head die 100 and the discharge droplet volume variations caused by nozzles 130 (sees FIGS. 4A-4C) are generated by this distribution, thereby causing the unevenness in the concentration of the output image.

Note that in one embodiment the displacement amount distribution of piezo actuator 110 is conceivably caused by an in plane distribution of a film thickness of a piezoelectric film 142 (see FIG. 4) of inkjet head die 100.

With a given sputtering devices, material sputtered and discharged from a target may deposit more in the center of a silicon wafer 120 (see FIG. 13) and then more thinly as distance from the center increases. Accordingly, the film thickness of piezoelectric film 142 formed by a sputtering method is relatively thick in the center of silicon wafer 120 and becomes relatively thinner as distance from the center increases, resulting in a concentric film thickness distribution. The film thickness distribution of piezoelectric film 142 affects the displacement amount distribution of piezo actuator 110, controlling the displacement amounts of different portions of the piezoelectric film across inkjet head die 100.

Configuration of One Embodiment of a Piezo Actuator

FIG. 4(*a*) is a top view of the piezo actuator 110, and FIG. 4(*b*) is a cross sectional view along line 4*b*-4*b* in FIG. 4(*a*).

A plurality of inkjet head dies 100 (not illustrated in FIG. 4) are arranged on silicon wafer 120 (an example of a substrate), and the plurality of pressure chambers 132 that store ink and an ink flow path (not illustrated) that links the plurality of pressure chambers 132 are formed on each of the plurality of inkjet head dies 100. Additionally, the plurality of piezo actuators 110 are formed to correspond to the plurality of pressure chambers 132, respectively. Furthermore, overlapping inkjet head die 100 of silicon wafer 120 and a die of a silicon wafer 122 that forms nozzle 130 configures inkjet head 200 that links pressure chamber 132 and nozzle 130.

Piezo actuator 110 includes a lower electrode 140, piezoelectric film 142, and an upper electrode 144. The plurality of piezo actuators 110 use lower electrode 140 (an example of a common electrode) and piezoelectric film 142 in common, and one of the upper electrodes 144 (an example of an individual electrode) is arranged to correspond to each of piezo actuators 110.

In one embodiment, PZT (Pb (Zr, Ti) $O_3$: Lead zirconate titanate) is used in piezoelectric film 142 (an example of a piezoelectric body film).

In one embodiment, upper electrode 144 is centered on a center 132*a* of pressure chamber 132 and is a ring type electrode having an elliptical ring shape that corresponds to the shape of pressure chamber 132. Upper electrode 144 can be given an appropriate ring shape such as a circular, polygonal ring shape to correspond to the shape of pressure chamber 132.

The ring width, which is the length in the width direction orthogonal to the circumferential direction of the ring shape of upper electrode 144, is x, and upper electrode 144 functions as a ring type electrode having ring width x. In one embodiment, upper electrode 144 use oxide electrodes, such as, for example, but not limited to, $IrO_x$ (iridium oxide), ITO (indium tin oxide), and $RuO_x$ (ruthenium oxide), to suppress reactions with piezoelectric film 142 and to improve adhesion.

A wire 150 (or other conductor) is connected to upper electrode 144. Wire 150 causes piezo actuator 110 to function as a pressure generating element, and thus applies a signal voltage to upper electrode 144 with lower electrode 140 as the reference potential.

In one embodiment, piezo actuator 110 configured in this way sets the voltage of the upper electrode 144 to off (reference potential) during ink discharge standby, which helps with long term durability thereof.

Furthermore, in one embodiment, the voltage of upper electrode 144 is set to on (signal voltage is applied) during ink discharge. When the applied voltage of upper electrode 144 is set to on, piezo actuator 110 drives the position of inner diameter of the ring shape of upper electrode 144 to be displaced in a convex manner in the upward direction in FIG. 4B (the direction that increases the volume of pressure chamber 132, hereinafter referred to as the reverse direction of pressure chamber 132) as the inflection point of the displacement profile. This makes ink to be sucked inside pressure chamber 132 from the supply flow path (not illustrated). Setting the voltage to off from this state allows piezo actuator 110 to return to the original shape thereof and cause the ink inside pressure chamber 132 to discharge through nozzle 130 simultaneously.

Making Discharge Droplet Volume Variations Uniform

Figure 4C:
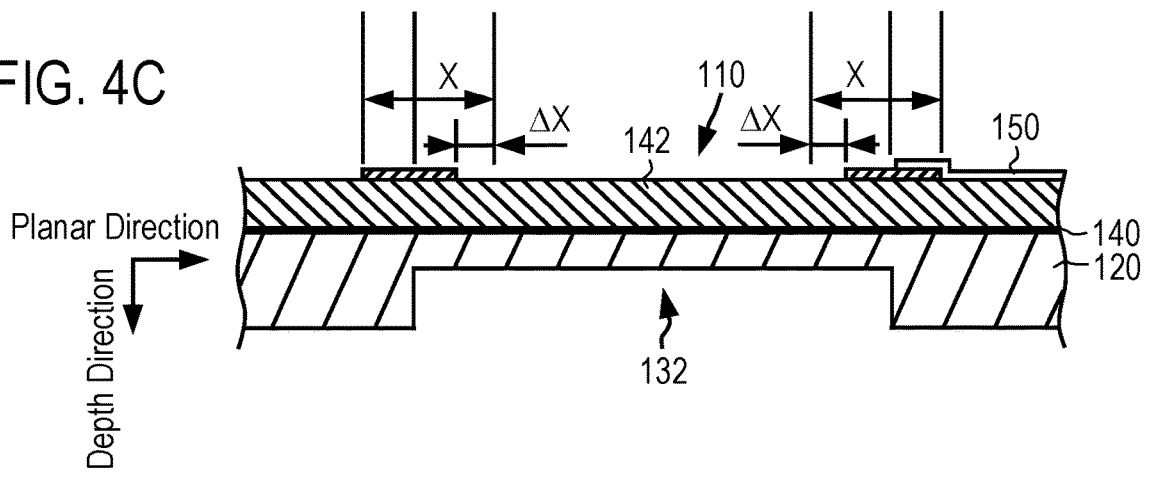

The displacement amount of piezoelectric film 142 can be suppressed by narrowing the ring width x of upper electrode 144, thereby changing the position of the inflection point of the displacement profile. FIG. 4C is a cross sectional view that is similar to FIG. 4B, and illustrates piezo actuator 110 where the ring width of upper electrode 144 has been narrowed by exactly Δx. In this case, the outer diameter of the ring shape of upper electrode 144 is fixed, and thus the ring width of upper electrode 144 is set to (x−Δx) by widening the inner diameter of the ring shape by exactly Δx.

When the ring width is narrowed by exactly Δx in this way, the position of the inner diameter of upper electrode 144, which is the position of the inflection point of the displacement profile of piezo actuator 110, changes according to the size of Δx, and thus the displacement amount decreases. In one embodiment, this characteristic is used to make the displacement amounts of the plurality of piezo actuators 110 of inkjet head die 100 uniform, and thus makes the discharge droplet volumes uniform. Specifically, the ring width is made relatively narrow where the original displacement amount is high, and the ring width is made relatively wide where the displacement amount is low. In one embodiment, the ring width of upper electrode 144 is corrected and the ring width is given a distribution by using correction coefficients that offset the in-plane distribution of the film thickness of piezoelectric film 142 of inkjet head die 100.

Figure 5A:
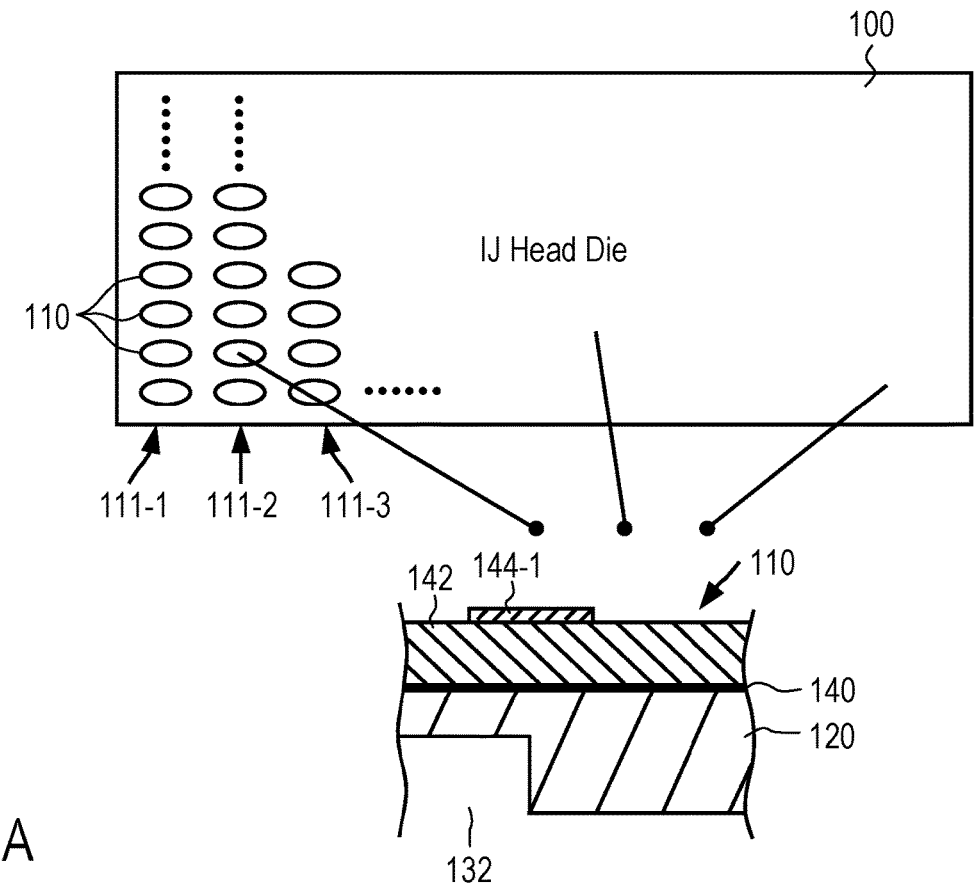
FIGS. 5A-5B are diagrams for illustrating an inkjet head die configured by consolidating the ring width of an upper electrode.
Figure 5B:
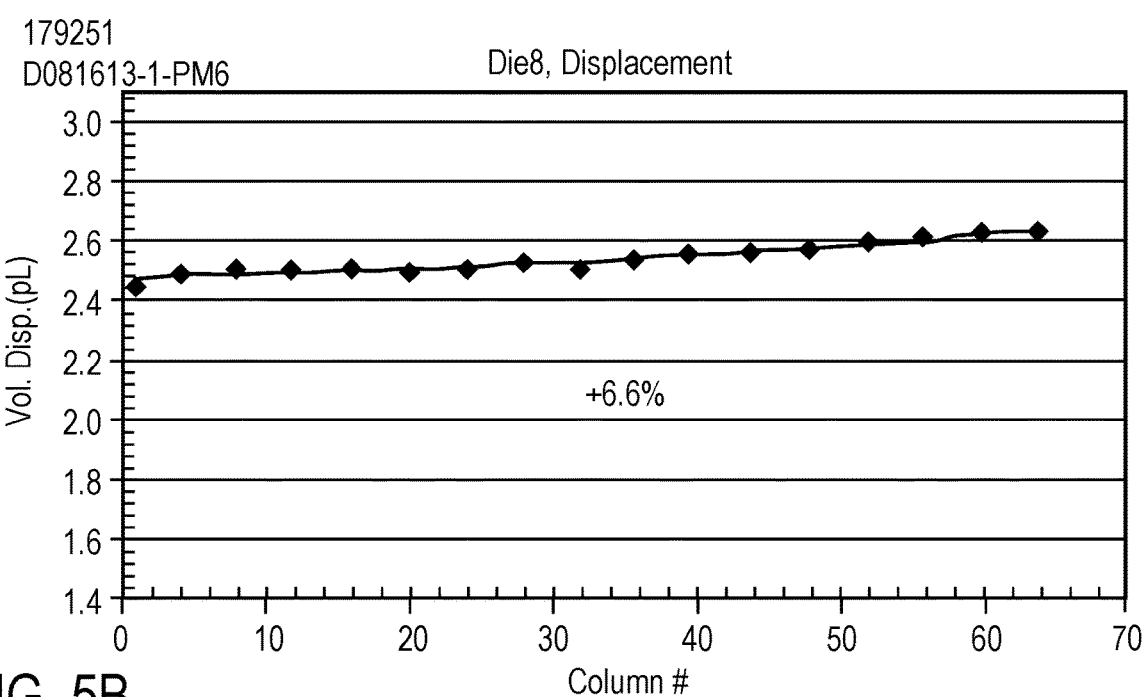

FIG. 5A is a diagram illustrating inkjet head die 100 in which each of the piezo actuators 110 is configured from upper electrodes 144-1 and each has the same ring width. Furthermore, FIG. 5B is a graph illustrating the distribution of discharge droplet volumes through nozzles 130 (not illustrated in FIGS. 5A-5B) corresponding to piezo actuators 110 illustrated in FIG. 5A where the horizontal axis shows the positions of piezo actuator columns 111-*k* (k equals 1, 2, . . . , n) that correspond to the form feeding orthogonal direction of the output image, and the vertical axis shows the discharge droplet volumes. In this case, the average value of the discharge droplet volumes for every four rows of piezo actuator columns 111-*k* is plotted on the graph. As illustrated in FIG. 5B, the discharge droplet volumes of piezo actuators 110 in this case have an in-plane distribution, and the uniformity of the discharge droplet volumes is +6.6%.

Figure 6A:
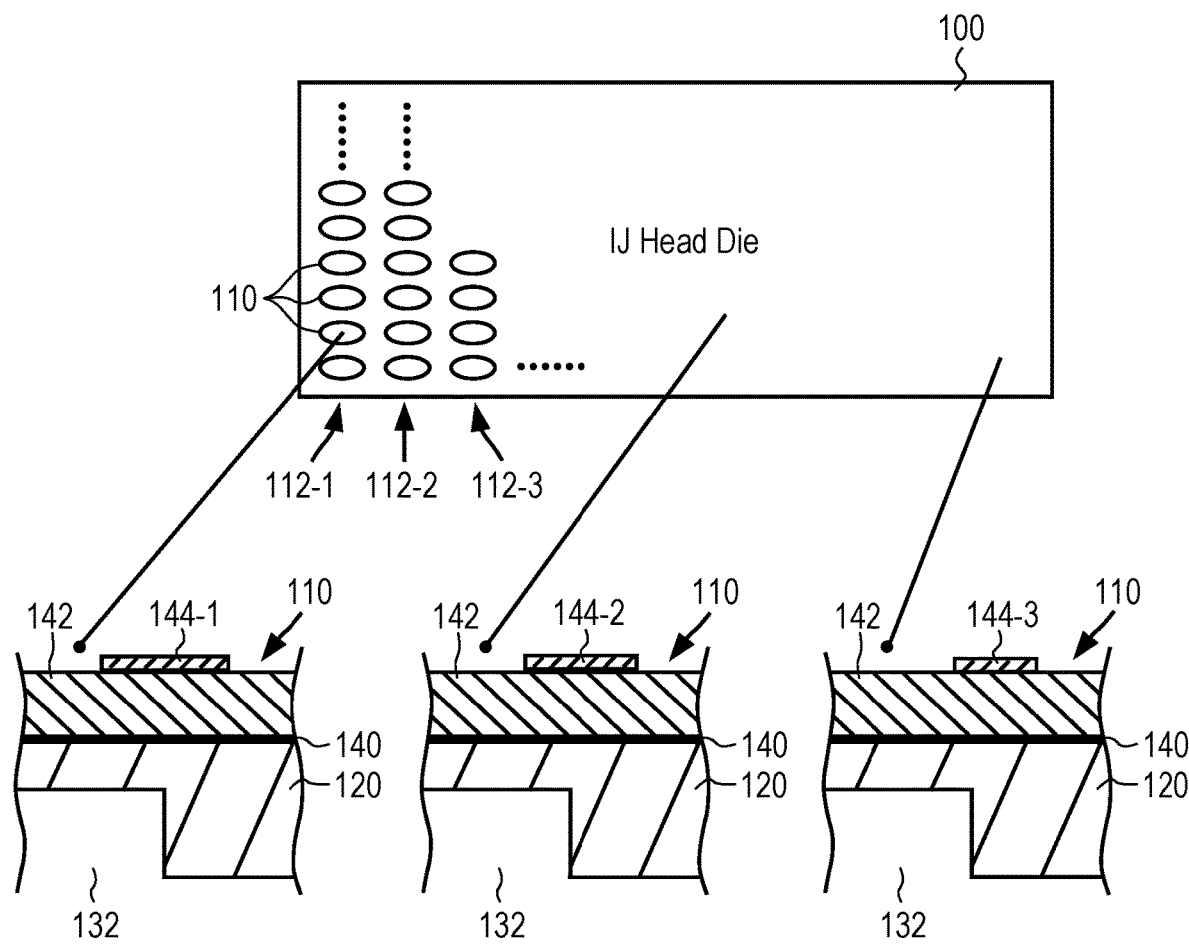
FIGS. 6A-6B are diagrams for illustrating an inkjet head die where the ring width of an upper electrode has been corrected to correspond to an in-plane position on a silicon wafer.
Figure 6B:
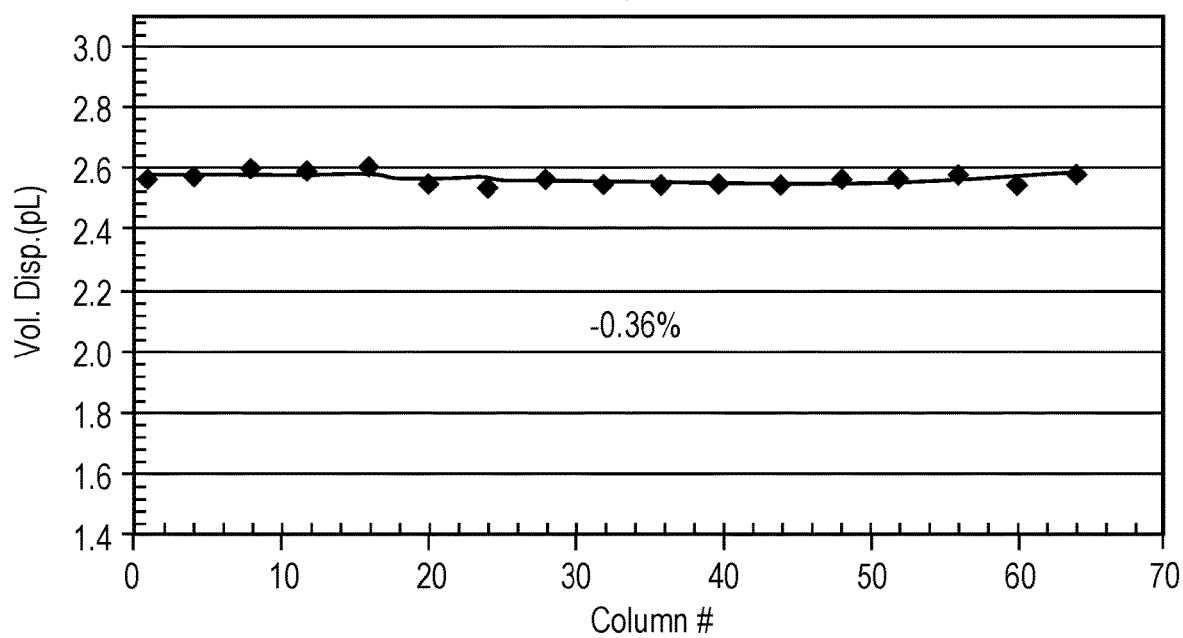

Furthermore, FIG. 6A is diagram illustrating inkjet head die 100 where each of piezo actuators 110 is corrected based on the in-plane position of silicon wafer 120 and is configured from upper electrodes 144-1, 144-2 and 144-3, each having a different ring width. Furthermore, FIG. 6B is a graph illustrating the distribution of discharge droplet volumes through the nozzles 130 (not illustrated in FIGS. 6A-6B) corresponding to piezo actuators 110 illustrated in 6A where the horizontal axis shows the positions of the piezo actuator columns 111-*k* (k=1, 2, . . . , n) that correspond to the form feeding orthogonal direction of the output image, and the vertical axis shows the discharge droplet volumes. Here, the average value of the discharge droplet volumes for every four rows of the piezo actuator columns 111-*k* is plotted on the graph. As illustrated in FIG. 6B, the discharge droplet volumes of piezo actuators 110 have been corrected for in-plane distribution in this case, and the uniformity of the discharge droplet volumes is −0.36%. Adjusting the ring width of upper electrode 144 based on the in-plane position of the silicon wafer 120 in this way allows the displacement amounts of the plurality of piezo actuators 110 and the discharge droplet volumes through the nozzles 130 to be made uniform.

Other Aspects of the Piezo Actuator

Other aspects of the piezo actuator are described below. Portions that are shared with piezo actuator 110 are given the same reference numerals and detailed descriptions thereof are omitted.

Figure 7A:
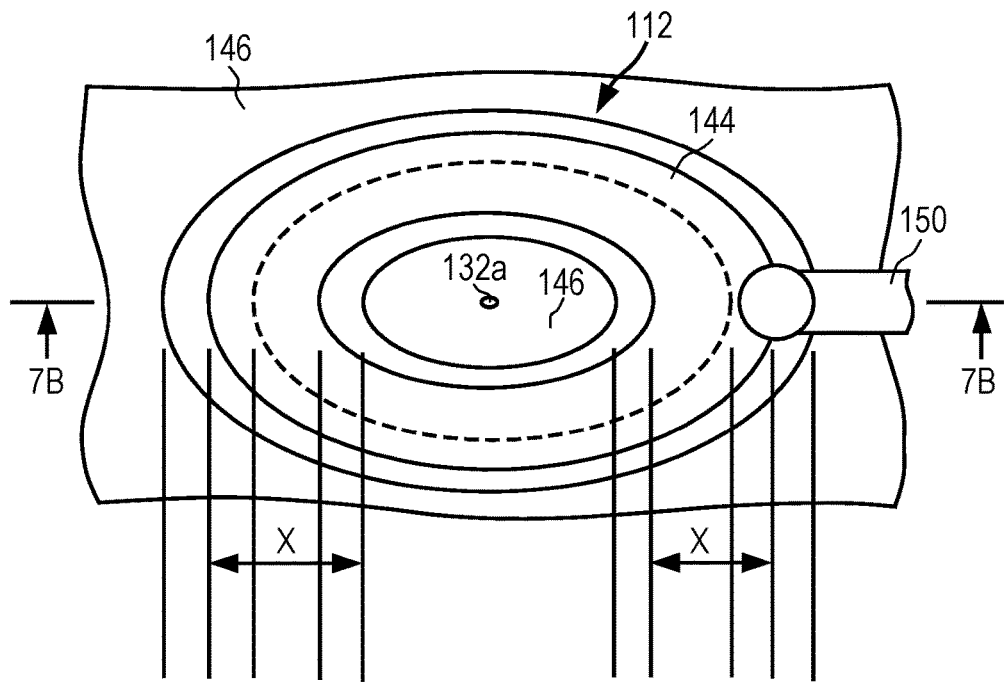
FIGS. 7A-7C are diagrams illustrating one embodiment of a piezo actuator.
Figure 7B:
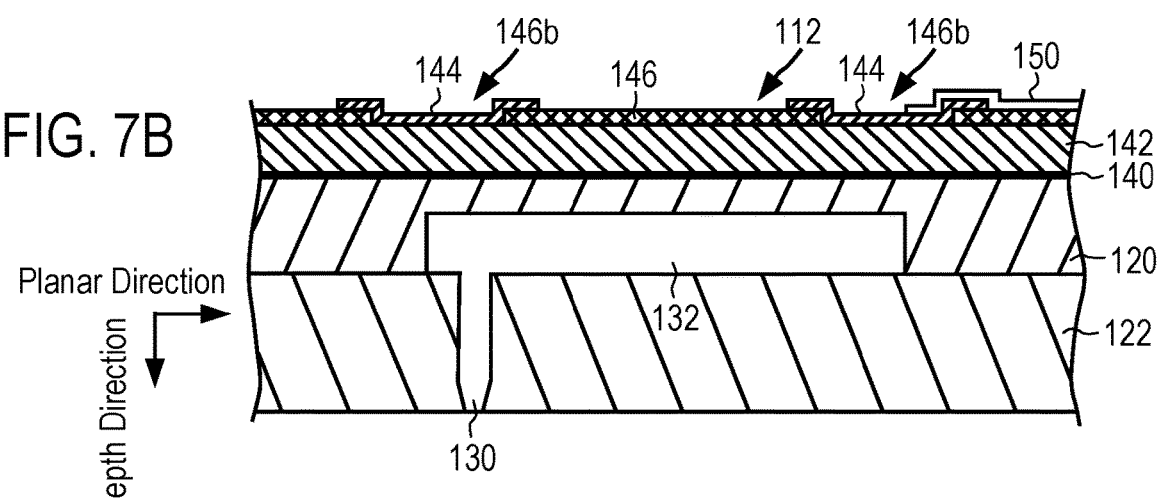

FIG. 7(a) is a top view of a piezo actuator 112 (an example of a piezoelectric element), and FIG. 7(b) is a cross sectional view along line 7b-7b in FIG. 7(a).

A plurality of piezo actuators 112 are formed on each of the plurality of inkjet head dies 100. Each of the piezo actuators 112 corresponds with one of pressure chambers 132 where the ink is captured, respectively, and includes lower electrode 140, piezoelectric film 142, an insulating film 146, and upper electrode 144. In one embodiment, the plurality of piezo actuators 112 use lower electrode 140 and piezoelectric film 142 in common, and one of upper electrodes 144 is arranged to correspond to each of piezo actuators 112.

In one embodiment, insulating film 146 is in between piezoelectric film 142 and upper electrode 144. In one embodiment, center 132a of pressure chamber 132 is centered on the center of upper electrode 144, and an opening 146b is provided in insulating film 146 with an elliptical ring shape that corresponds to the shape of pressure chamber 132. In one embodiment, opening 146b is given an appropriate ring shape such as, for example, but not limited to, a circular, polygonal ring shape to correspond to the shape of pressure chamber 132.

The ring width, which is the length in the width direction orthogonal to the circumferential direction of the ring shape of the opening 146b, is x. Furthermore, upper electrode 144 is placed along opening 146b, and piezoelectric film 142 and upper electrode 144 are electrically connected through opening 146b. Accordingly, the portion of upper electrode 144 that is electrically connected to piezoelectric film 142 in opening 146b becomes a displacement driving portion, and thus piezo actuator 112 substantially functions as a piezoelectric element having a ring like electrode with an electrode width of x. Furthermore, wire 150 is connected to upper electrode 144. In this way, piezo actuator 112 sets the voltage of upper electrode 144 to off (reference potential) during ink discharge standby.

Also, in one embodiment, the voltage of upper electrode 144 is set to on (signal voltage is applied) during ink discharge, and the position of the inner diameter of the ring shape of opening 146b is driven to be displaced in a convex manner in the upward direction (reverse direction of the pressure chamber 132) in FIG. 7B as the inflection point of the displacement profile, and thus ink is sucked from the supply flow path (not illustrated) inside pressure chamber 132. Setting the voltage to off from this state allows piezo actuator 112 to return to the original shape thereof and the ink inside pressure chamber 132 is discharged through nozzle 130.

Figure 7C:
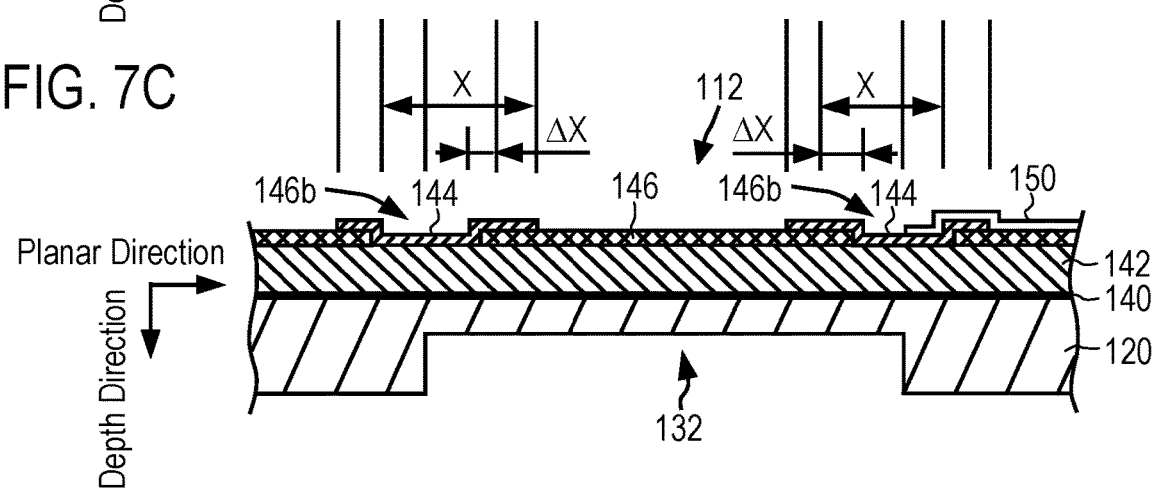

The displacement amount of piezoelectric film 142 is suppressed by making the ring width of opening 146b narrower in piezo actuator 112. FIG. 7C is a cross sectional view that is similar to FIG. 7B, and illustrates piezo actuator 112 where the ring width of opening 146b has been narrowed by exactly Δx. In this case, the outer diameter of the ring shape of opening 146b is fixed, and thus the ring width of opening 146b is set to (x−Δx) by widening the inner diameter of the ring shape. Note that the shape of upper electrode 144 has not changed.

When the ring width is narrowed by exactly Δx in this way, the position of the inner diameter of opening 146b, which is the position of the inflection point of the displacement profile of piezo actuator 112, changes according to the size of Δx, and thus the displacement amount decreases. This makes the displacement amounts of the plurality of piezo actuators 112 of inkjet head die 100 uniform, which allows the discharge droplet volumes to be made uniform.

Figure 8A:
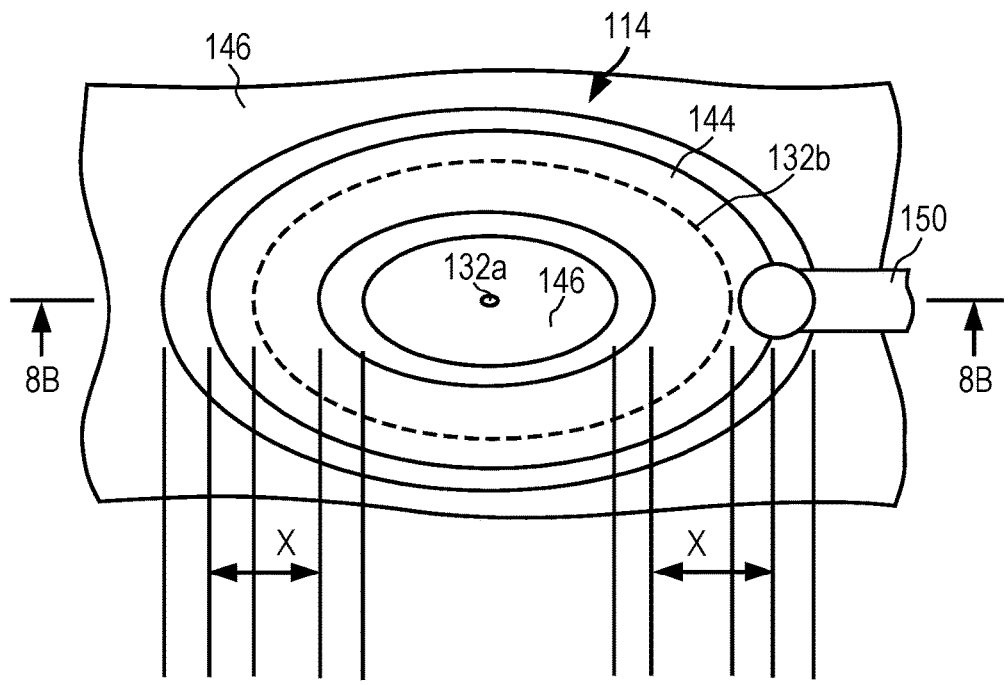
FIGS. 8A-8C are diagrams illustrating one embodiment of a piezo actuator.
Figure 8B:
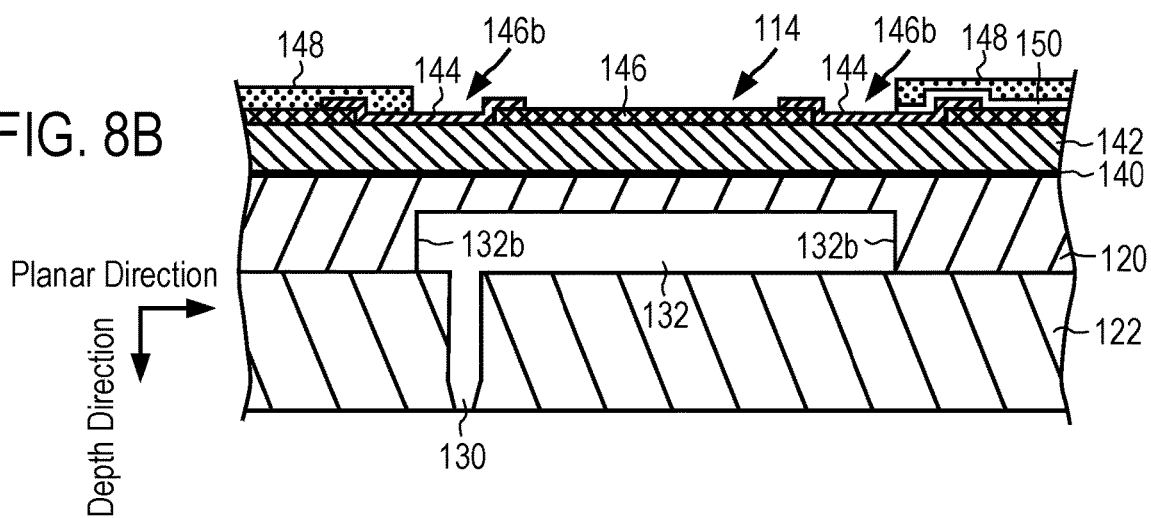

FIG. 8A is a top view of a piezo actuator 114 (an example of a piezoelectric element), and FIG. 8B is a cross sectional view along line 8b-8b in FIG. 8A. Piezo actuator 114 includes, relative to piezo actuator 112, an inflection point adjusting layer 148 on upper electrode 144 (on the side opposite that of piezoelectric film 142 of upper electrode 144) through an inflection point adjusting layer forming step. That is, piezo actuator 114 substantially functions as a piezoelectric element having a ring type electrode with electrode width x.

In one embodiment, inflection point adjusting layer 148 is laminated on the insulating film 146 on the outside of the ring shape formed by opening 146b, protruding inward from outside the ring shape relative to the opening 146b to a position (hereinafter referred to simply as the position of inner wall 132b of pressure chamber 132) where an inner wall 132b, which is in the depth direction of silicon wafer 120, of pressure chamber 132 extends to opening 146b. Inflection point adjusting layer 148, may be, for example, SU-8 (manufactured by MicroChem, Inc.). In this way, piezo actuator 114 sets the voltage of upper electrode 144 to off (reference potential) during ink discharge standby. Furthermore, the voltage of upper electrode 144 is set to on (signal voltage is applied) during ink discharge, and the position of the edge of inflection point adjusting layer 148 that protrudes relative to opening 146b is driven to be displaced in a convex manner in the upward direction (reverse direction of the pressure chamber 132) in FIG. 8B as the inflection point of a specific displacement profile, and thus ink is sucked from the supply flow path (not illustrated) inside pressure chamber 132. Setting the voltage to off from this state allows piezo actuator 114 to return to the original shape thereof and ink inside pressure chamber 132 to be discharged through nozzle 130.

Figure 8C:
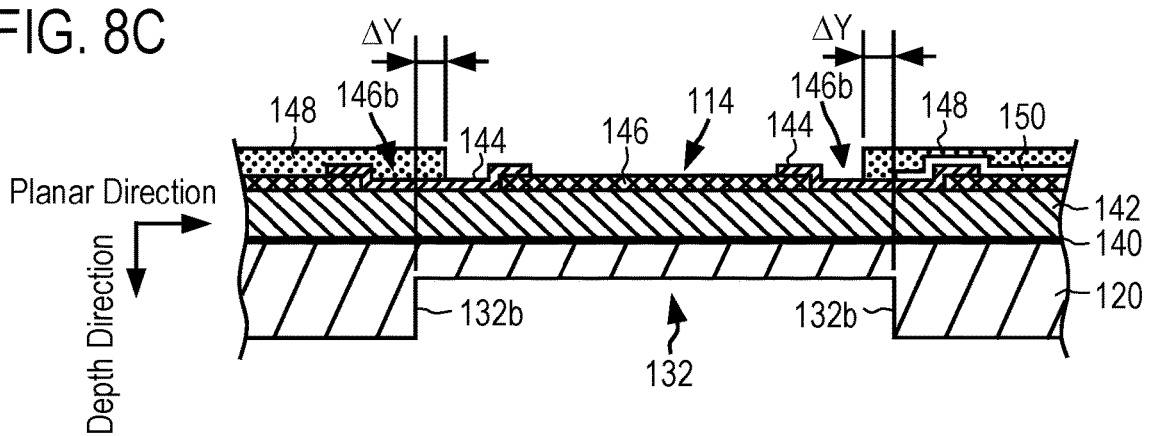

The displacement amount of piezoelectric film 142 is suppressed by making the amount that inflection point adjusting layer 148 protrudes relative to opening 146b wider in piezo actuator 114. FIG. 8C is a cross sectional view that is similar to FIG. 8B, and illustrates piezo actuator 114 where the amount of overlap (the amount protruding from the position of inner wall 132b of pressure chamber 132) between opening 146b and inflection point adjusting layer 148 has been widened by exactly Δy. In this way, when the overlap amount is widened by exactly Δy, the position of the edge of inflection point adjusting layer 148, which is the position of the inflection point of the displacement profile of piezo actuator 114, changes according to the size of Δy, and thus the displacement amount of piezo actuator 114 decreases. This makes the displacement amounts of the plurality of piezo actuators 114 of inkjet head die 100 uniform, which allows the discharge droplet volumes to be made uniform.

An Example Method for Producing Masks for Correction Coefficients

Figure 9:
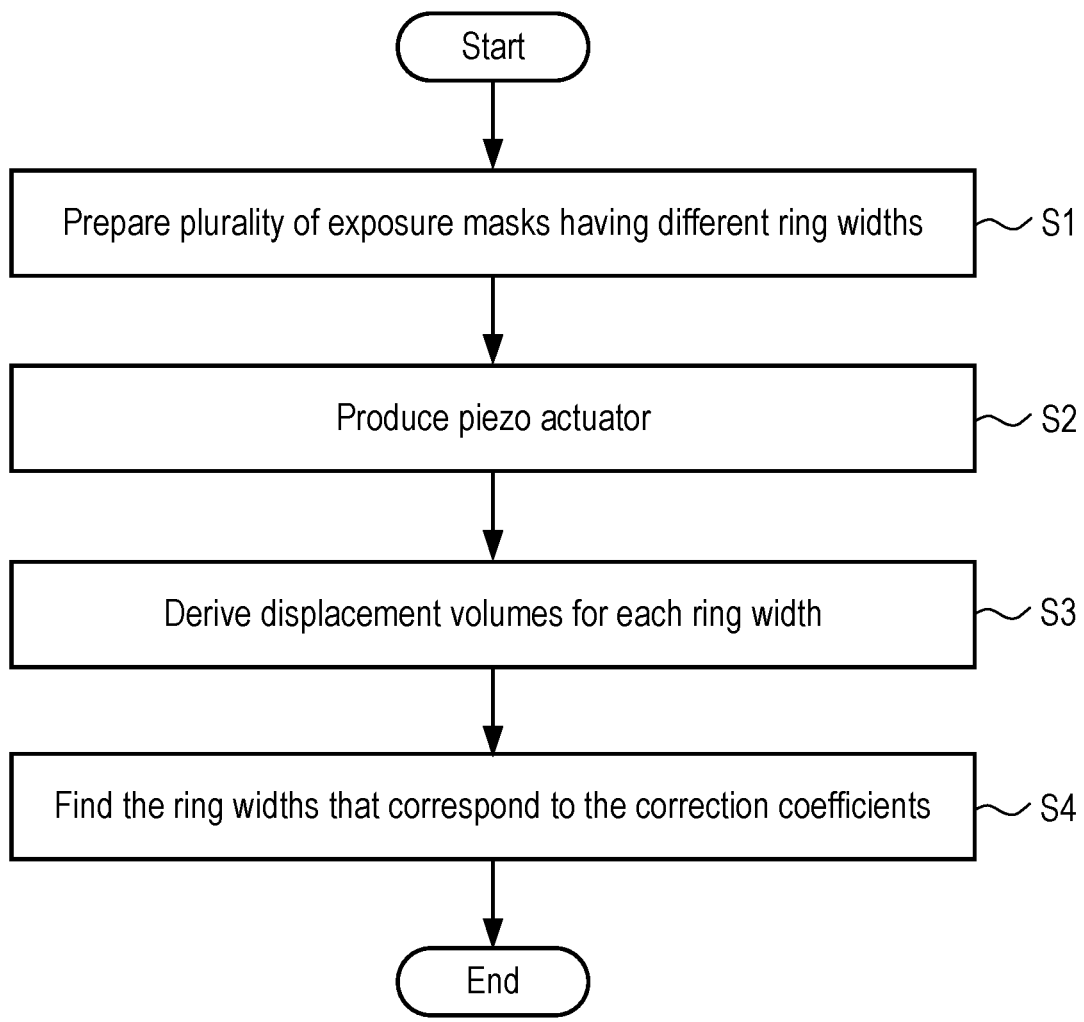
FIG. 9 is a flow chart illustrating one embodiment of a method for producing an exposure mask having correction coefficients that correspond to the displacement amount of a piezo actuator.

FIG. 9 illustrate one embodiment of a method for producing exposure masks having correction coefficients for correcting the displacement amounts of the piezo actuators. For purposes of illustrating the method, an example that uses piezo actuator 112 will be described.

Referring to FIG. 9, first, a plurality of exposure masks having different ring widths of opening 146b are prepared (step S1). As illustrated in FIG. 7C, the ring width fixes the outer diameter of the ring shape of opening 146b, and thus the ring width of opening 146b is narrowed by widening the inner diameter of the ring shape by exactly $\Delta x$. Accordingly, a plurality of exposure masks that are different by $\Delta x$ may be prepared.

Next, a plurality of exposure masks is used relative to each of silicon wafers 120 to produce piezo actuator 112 (step S2), and then a displacement volume of piezo actuator 112 is derived for each ring width (step S3). After deriving the displacement volumes for each ring width, the ring widths that correspond to the correction coefficients are generated (step S4).

Figure 10:
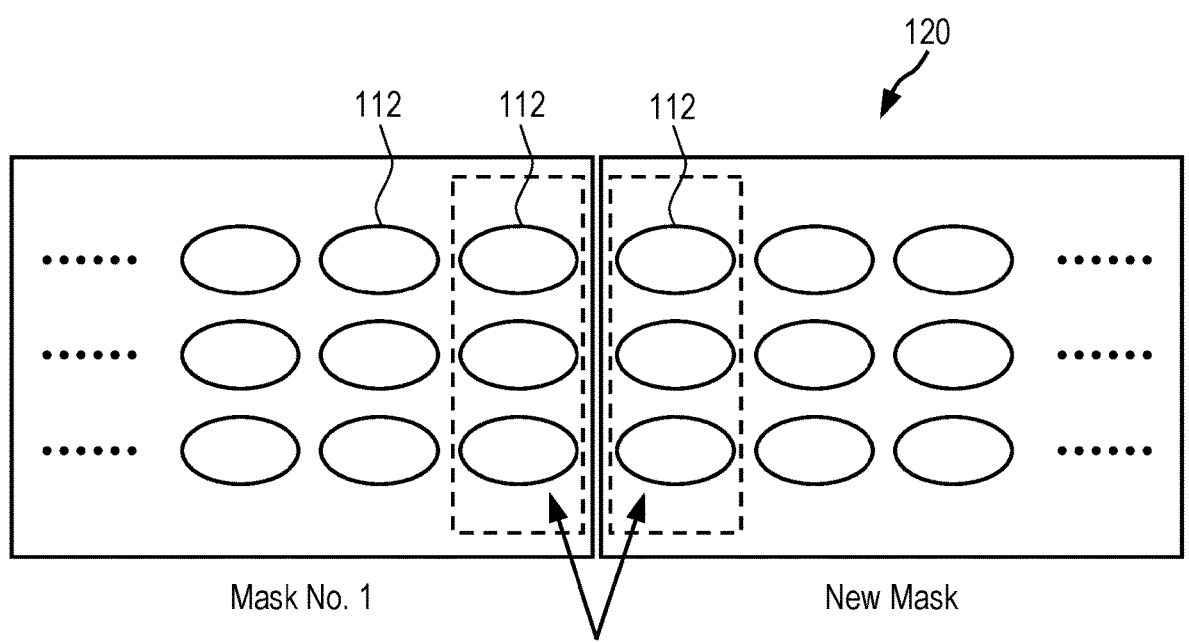
FIG. 10 is a diagram illustrating a piezo actuator with a different ring width formed where the value of a film thickness is close.

FIG. 10 illustrates the displacement volumes of piezo actuators 112, formed to the degree possible in locations close to the film thickness of piezoelectric film 142 (not illustrated in FIG. 10), are compared using a piezo actuator 112 that has been exposed and formed using an exposure mask as reference where $\Delta x=0$ (herein, the mask of mask No. 1) and a piezo actuator 112 that has been exposed and formed using an exposure mask where $\Delta x>0$ (new mask). In this case, the same voltage signal is applied to each of piezo actuators 112, and the displacement volume of each is then derived by measuring the displacement amounts using a scanning laser Doppler meter. This operation is repeated to find the ring widths that achieve the correction coefficients as the target values (step S4 of FIG. 9).

Figure 11:
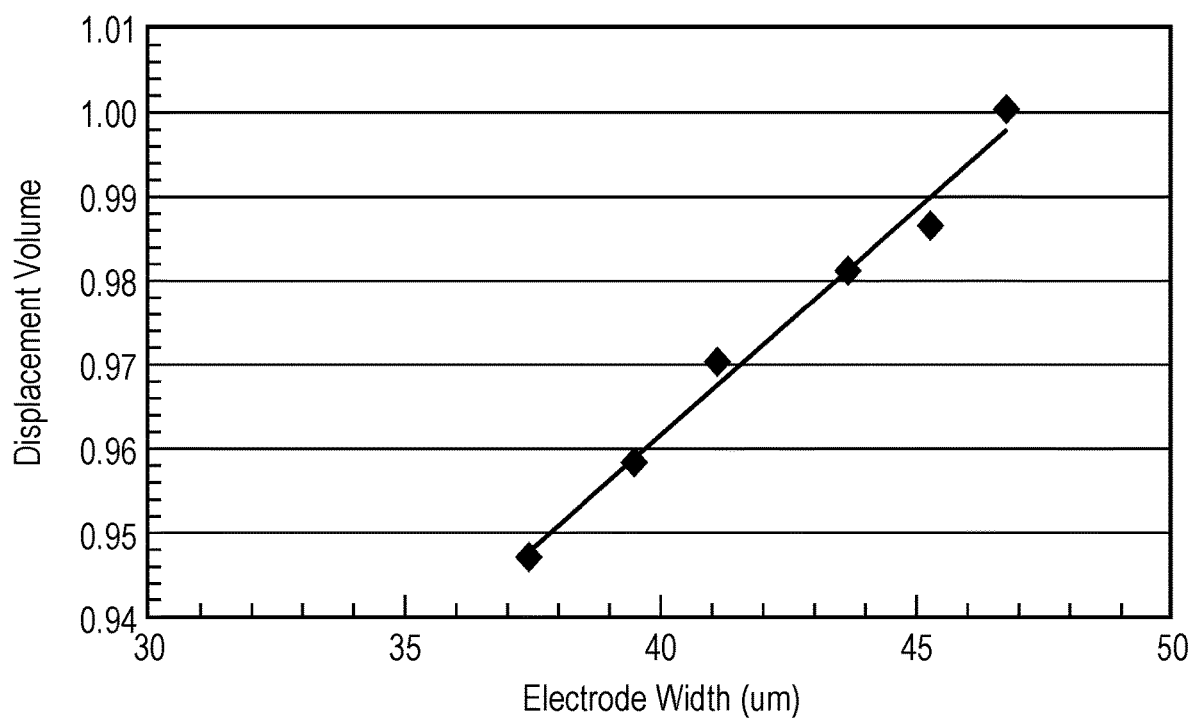
FIG. 11 is a graph illustrating a relationship between ring width and displacement volume.

FIG. 11 illustrates that there is a nearly linear relationship between the ring width and the displacement volume. Referring to FIG. 11, as the ring width is increased, the displacement volume increase nearly linearly.

FIG. 12 illustrates the ring widths of the masks of an example of finally determined correction coefficients and simultaneously illustrates the displacement volume measured value and resonant frequency in each of the exposure masks. Note that the displacement volume measured values and resonant frequencies illustrate values that have been normalized using the value of exposure mask No. 1 as reference where the correction coefficient is 1.00 ($\Delta x=0$). In this way, exposure masks No. 1 to No. 6 (an example of a plurality of exposure masks) with correction coefficients ranging from 1.00 to 0.95 in −0.01 stages are produced in one embodiment. The number of the exposure masks and correction coefficient steps may be are not limited to those described in FIG. 12; other numbers of exposure masks and correction coefficients may be used and determined as appropriate.

Note that, in one embodiment, there is almost no change in resonant frequency from piezo actuator 112 with a correction coefficient of 1.00 to piezo actuator 112 with a correction coefficient of 0.95 is 0.3%.

An Example Method for Producing Correction Coefficient Maps

Figure 13:
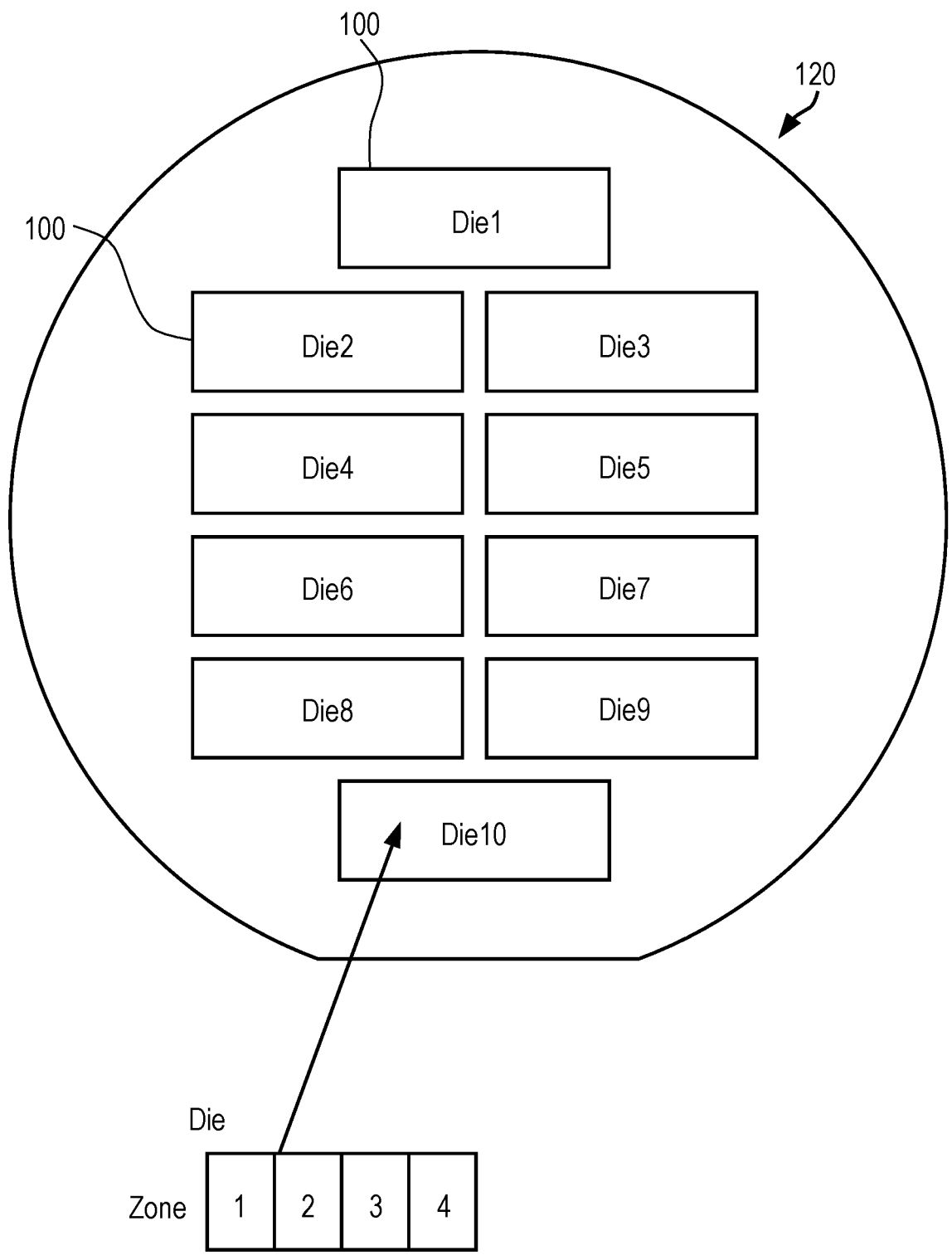
FIG. 13 is a diagram illustrating positions of a plurality of inkjet head dies on a silicon wafer.

FIG. 13 is a diagram illustrating an example of the positions of a plurality of inkjet head dies 100 on an element forming surface of silicon wafer 120. Here, silicon wafer 120 is divided into ten inkjet head dies 100 labelled Die 1 to Die 10. Furthermore, in the exposure step in the manufacturing process, each of inkjet head dies 100 is divided into four zones from Zone 1 to Zone 4 and then stepper exposed. That is, each zone is an exposure region from one stepper exposure, and one of the inkjet head dies 100 can use four desired exposure masks that are different for each zone.

Figure 14:
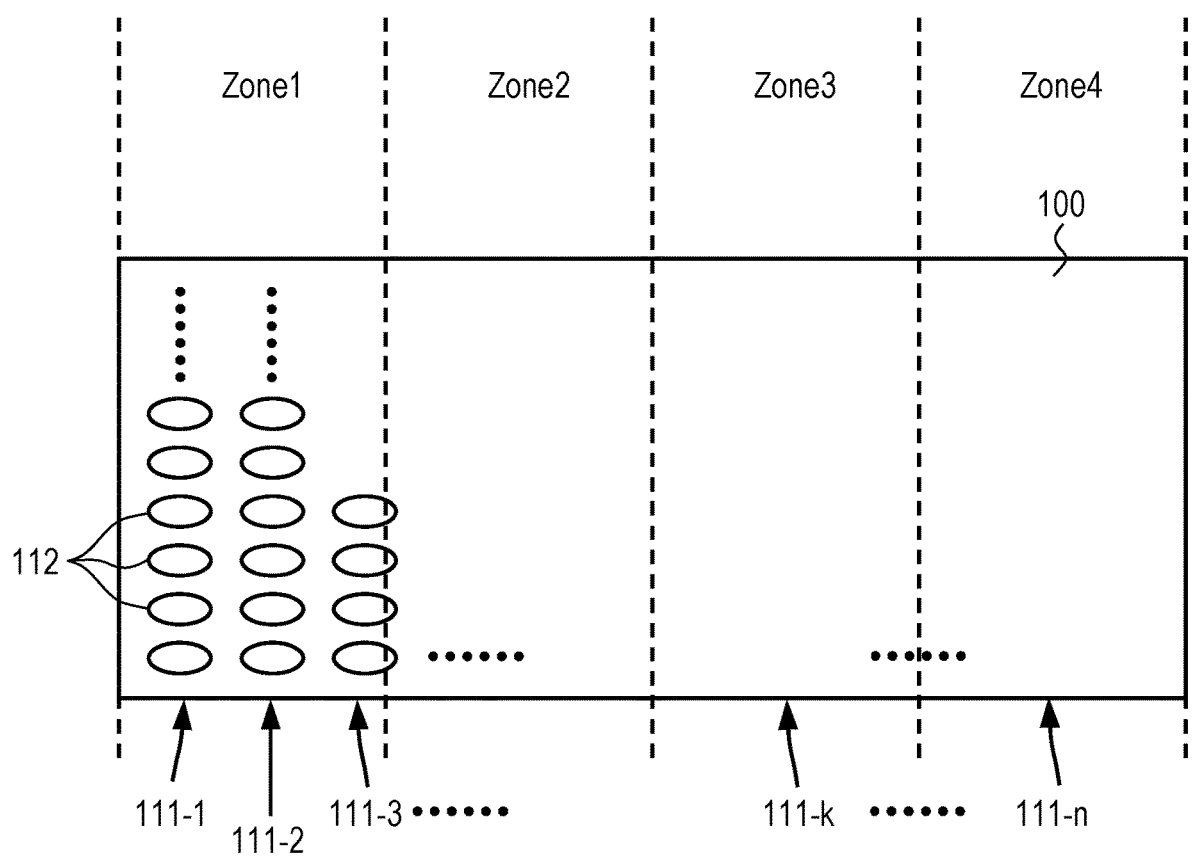
FIG. 14 is a diagram illustrating positions of a plurality of the piezo actuators in an inkjet head die.

Furthermore, as illustrated in FIG. 14, in one embodiment, the plurality of piezo actuators 112 are provided two dimensionally on the inkjet head dies 100, and plurality of piezo actuators 112 are located in piezo actuator columns 111-$k$ ($k=1, 2, \ldots, n$), respectively, in the vertical direction of the figure. Furthermore, piezo actuator columns 111-$k$ are arranged at fixed intervals in the width direction of FIG. 14.

Figure 15:
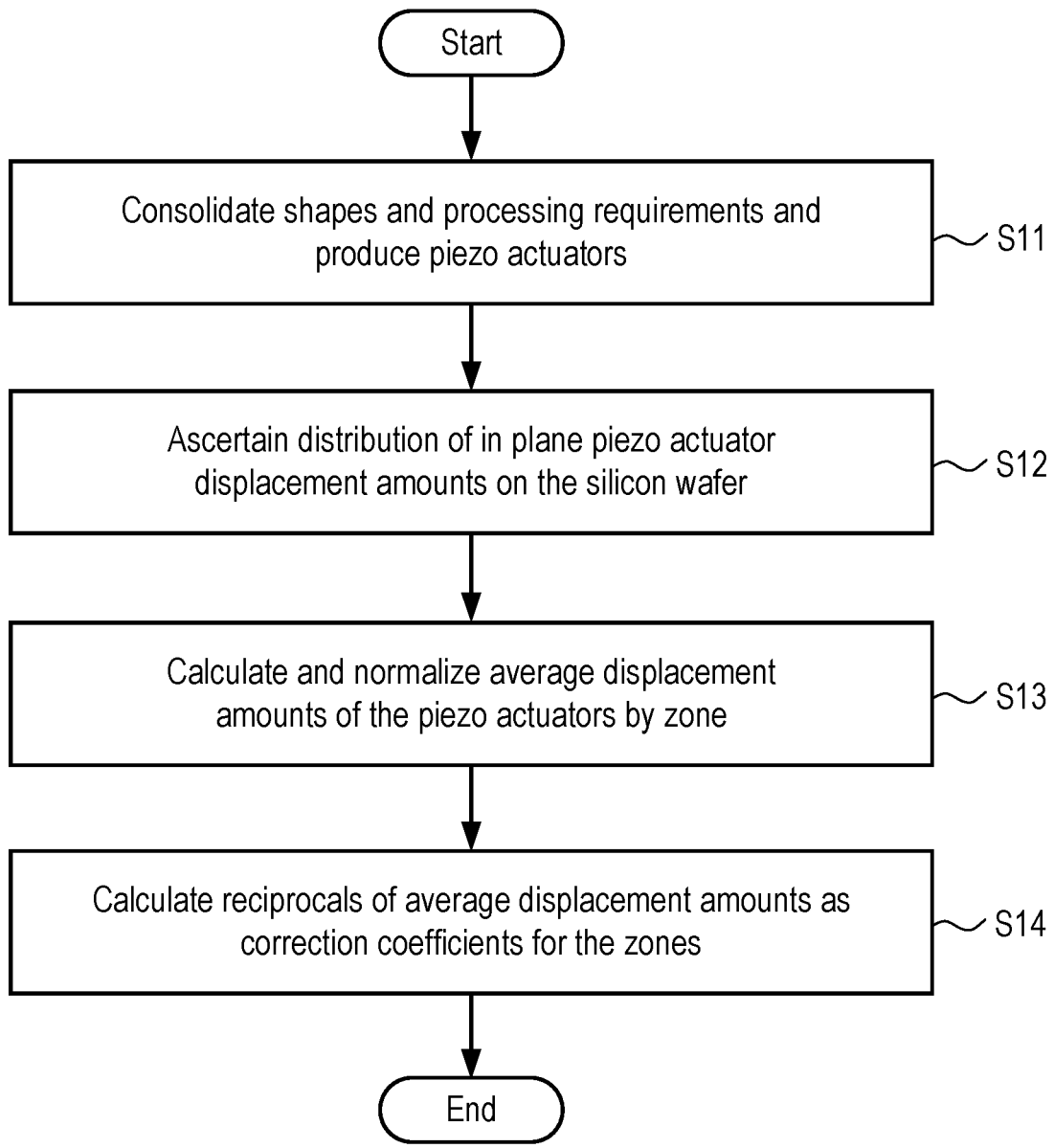
FIG. 15 is a flow chart illustrating one embodiment of a method for producing a correction coefficient map within the plane of a silicon wafer.

FIG. 15 illustrates a method for producing correction coefficient maps for each in plane position on silicon wafer 120 configured in this way in accordance with one embodiment. In this case, in one embodiment, correction coefficients are calculated by zone (by exposure region), which is one exposure region of a stepper exposure for the inkjet head dies 100.

Referring to FIG. 15, the shapes and processing requirements for lower electrode 140, piezoelectric film 142, upper electrode 144, and insulating film 146 are consolidated, and then the piezo actuators 112 are produced over the entire surface of silicon wafer 120 (step S11). At this point, a film thickness distribution is generated in the plane of silicon wafer 120 in piezoelectric film 142.

Figure 16A:
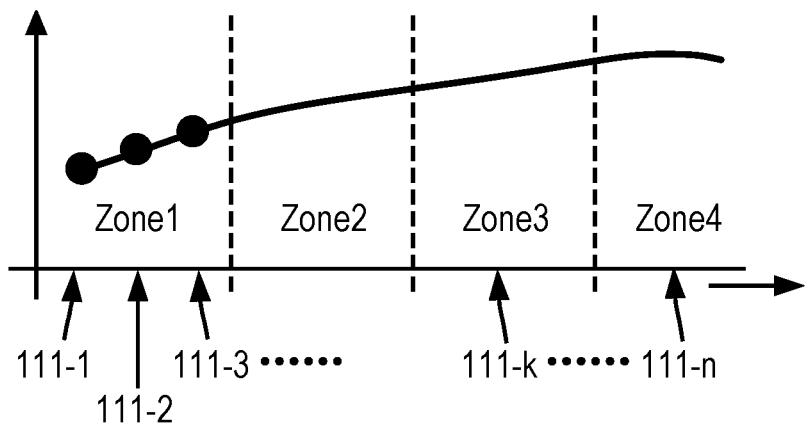
FIGS. 16A-16C are diagrams for illustrating the calculation of correction coefficients by zone for a given inkjet head die according to one embodiment.

Next, the same voltage signal is applied to the plurality of piezo actuators 112 of each zone, and then the distribution of the in-plane displacement amounts of piezo actuators 112 on silicon wafer 120 are determined. In one embodiment, this determination is made by measuring the displacement amounts using a scanning laser Doppler meter (step S12, an example of a displacement amount measuring step). This obtains the film thickness distribution of piezoelectric film 142. An example of the displacement amounts for piezo actuators 112 by zone of a given inkjet head die 100 are illustrated in FIG. 16A.

Figure 16B:
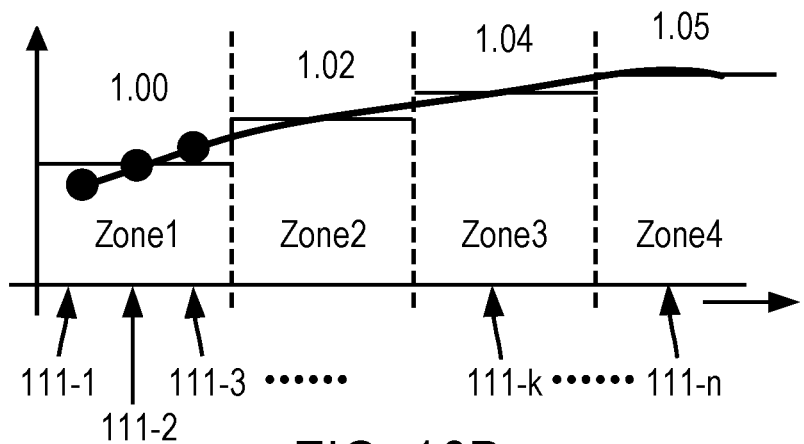

Next, the average value of the displacement amounts (average displacement amount) of the plurality of piezo actuators 112 is calculated by zone, and then the average displacement amount of each zone is normalized using the minimum value of the average displacement amounts of all of the zones (step S13). The average displacement amount for each zone is illustrated in FIG. 16B. Referring to FIG. 16B, the average displacement amounts are 1.00 for Zone 1, 1.02 for Zone 2, 1.04 for Zone 3, and 1.05 for Zone 4.

Lastly, in one embodiment, the reciprocals for the normalized average displacement amounts are calculated, and a correction coefficient map, with these values as the correction coefficients in the zones, is completed (step S14, an example of a correction coefficient calculating step).

Figure 16C:
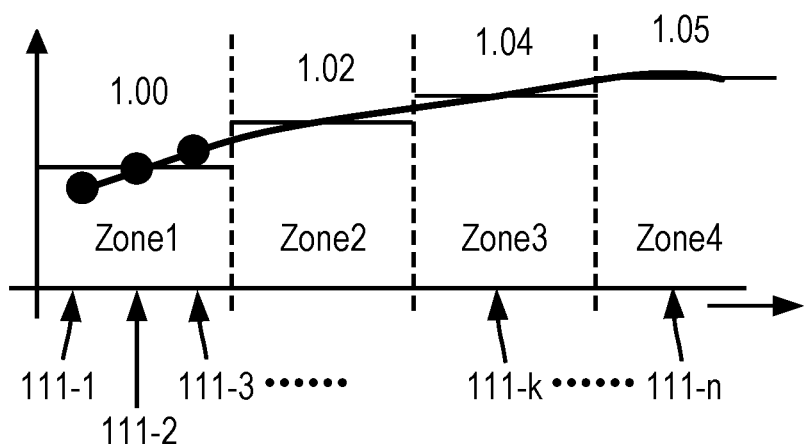

In one embodiment, based on the generated correction coefficient maps, exposure masks that are closest to the calculated correction coefficients are selected and used by zone during an exposure step of an actual manufacturing process. For example, as illustrated in FIG. 16C, the correction coefficient for Zone 1 is 1.00. Accordingly, the exposure mask of mask No. 1 may be used relative to Zone 1, as illustrated in FIG. 12. In the same way, the correction coefficients of Zones 2, 3, and 4 are 0.98, 0.96, and 0.95, respectively. Accordingly, the exposure masks of masks No. 3, 5 and 6 may be used relative to Zones 2, 3, and 4, respectively, as illustrated in FIG. 12.

Selecting and using the exposure masks in this way sets the positions of the inflection points of the displacement profiles of piezo actuators 112 of each zone to correspond to in plane positions on silicon wafer 120, and thus the displacement amounts of piezo actuators 112 are made to be uniform.

Another Example Method for Producing Masks for Correction Coefficients

An alternative method for producing exposure masks having correction coefficients that correspond to the displacement amounts of the piezo actuators may be used. This method will be described in conjunction with the piezo actuator 114 of FIGS. 8A-8C. In this case, a plurality of exposure masks having different protruding amounts for inflection point adjusting layer 148 are prepared, and piezo actuators 114 are produced on silicon wafer 120. As illustrated in FIG. 8C, the position of inner wall 132b of pressure chamber 132 is used as a reference for the protruding amount. For the purpose of this example, in one embodiment, the thickness of inflection point adjusting layer 148 is assumed to be 10 micrometers. Furthermore, in this case, the displacement volumes of piezo actuators 114 are derived by protruding amount to find the protruding amount that achieves the correction coefficient as the target value.

FIG. 17 illustrates an example of the protruding amounts of the masks of the finally determined correction coefficients and the displacement volume measured value and resonant frequency in each of the exposure masks. Note that the displacement volume measured values and resonant frequencies illustrate values that have been normalized using the value of exposure mask No. 1 where the correction coefficient is 1.00. Referring to FIG. 17, exposure masks No. 1 to No. 6 with correction coefficients ranging from 1.00 to 0.95 in—0.01 steps have been produced. Note that the change in resonant frequency from the piezo actuator 112 with a correction coefficient of 1.00 to the piezo actuator 112 with a correction coefficient of 0.95 is 1.1%, and thus, while the change amount is larger than piezo actuator 112, it is found that the degree of the change is not a problem in practical terms.

Another Form of the Method for Producing Correction Coefficient Maps

Figure 18:
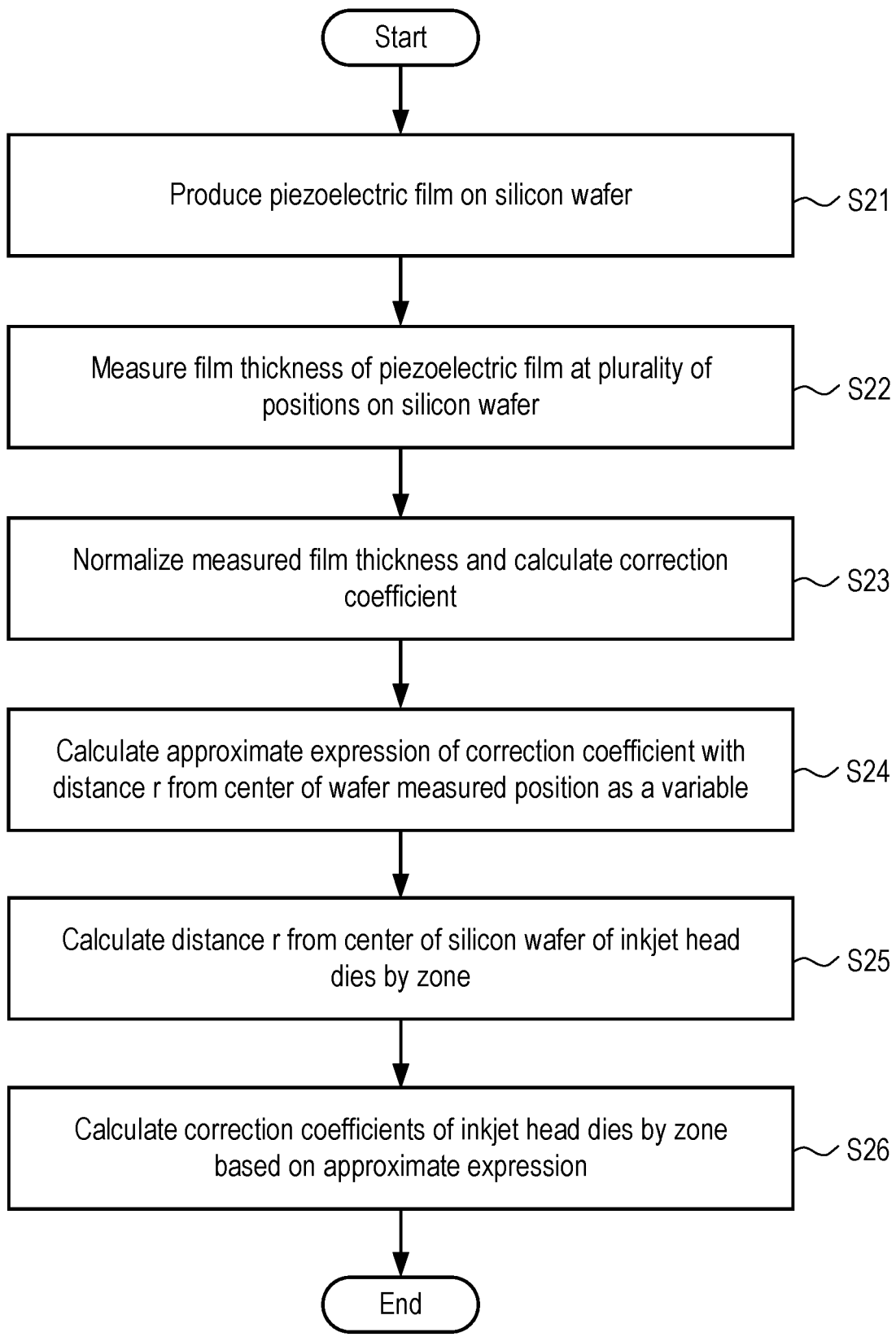
FIG. 18 is a flow chart illustrating one embodiment of another aspect of the method for producing a correction coefficient map for a silicon wafer.

FIG. 18 illustrates another embodiment of a method for producing correction coefficient maps for silicon wafer 120. In one embodiment, a correction coefficient map that corresponds to a distance from a reference point on silicon wafer 120 is produced.

Referring to FIG. 18, piezoelectric film 142 is produced over the entire surface of silicon wafer 120 as part of the process for forming piezo actuator 112 (step S21). At this point, the film thickness distribution is generated in the plane of silicon wafer 120 in piezoelectric film 142 formed.

Figure 19:
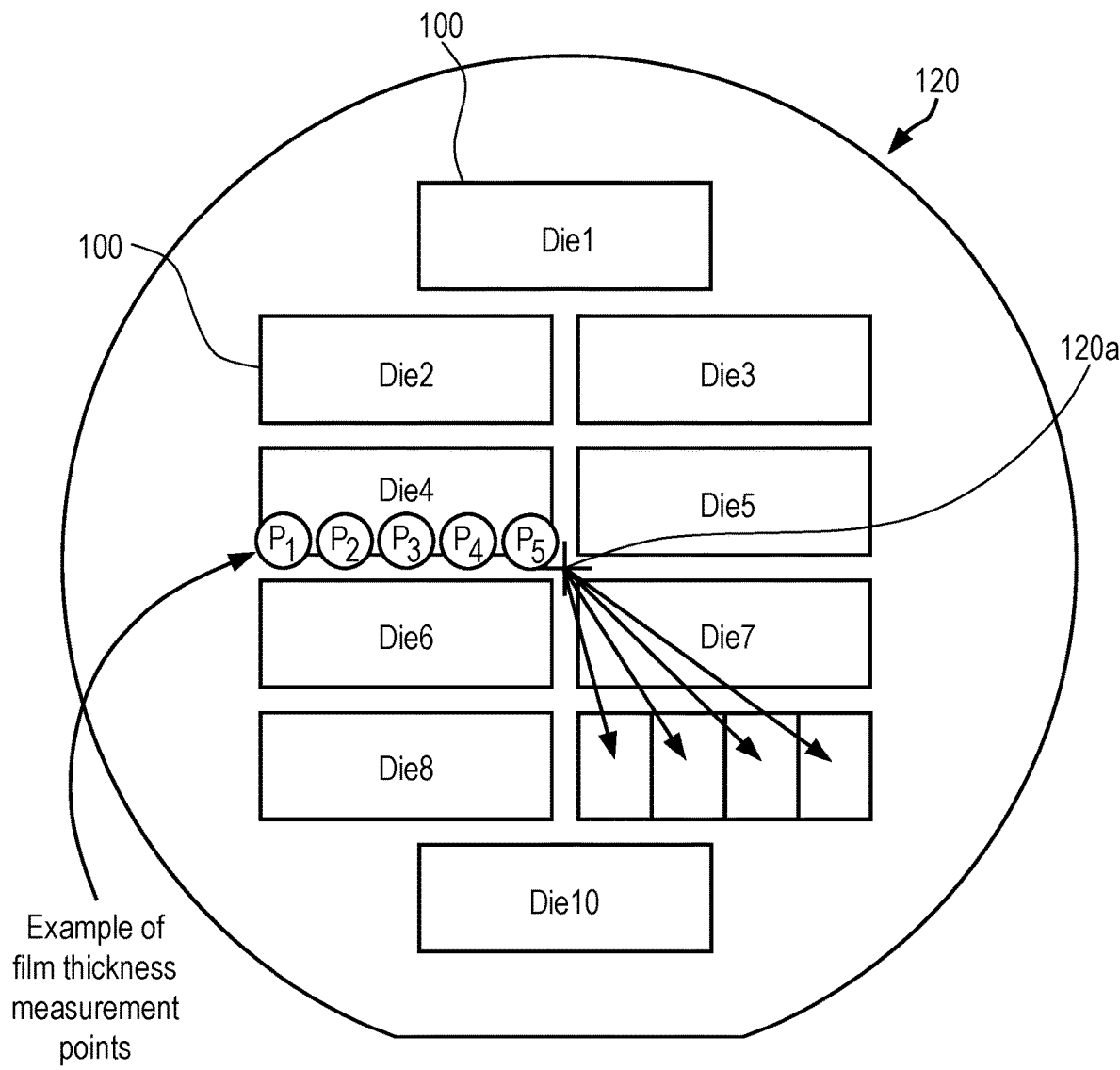
FIG. 19 is a diagram illustrating a center of the silicon wafer and film thickness measurement points P1, P2, P3 and P4.

Next, the film thickness of piezoelectric film 142 is measured in a plurality of positions from the edge to the center of silicon wafer 120. This may be performed using an optical interference film thickness measuring device (step S22, an example of a piezoelectric body film measuring step). In the example illustrated in FIG. 19, the film thickness of piezoelectric film 142 is measured at five points, being center 120a (an example of a reference point) of silicon wafer 120 and measuring points P1, P2, P3, and P4, which are positions at distances of 20, 30, 40 and 50 (units: millimeters) from the center 120a, respectively (an example of by distance from a reference point).

After measuring the piezoelectric film thickness, the film thicknesses of the piezoelectric film 142 of the five measured points are normalized using the minimum value, and the reciprocal of the normalized value is taken as the correction coefficient (step S23, an example of correction coefficient calculating step). The distances and the film thicknesses of piezoelectric film 142 from center 120a of silicon wafer 120, with the numeric values normalized using the minimum value, and the reciprocals thereof (correction coefficients) are illustrated in FIG. 20.

Additionally, using distance r from center 120a of silicon wafer 120 as a variable, an approximate expression F(r) is derived based on the distances from center 120a of silicon wafer 120 and the correction coefficients illustrated in FIG. 20 (step S24). In one embodiment, a quadratic function is used and this approximate expression is typically sufficient and can be expressed as follows.

$$F(r)=a_0+a_1r+a_2r^2 \qquad \text{(Expression 1)}$$

Next, distances r from center 120a of silicon wafer 120 to the centers of the zones of inkjet head dies 100 are calculated (step S25). These distances r are calculated from mask design CAD data.

Finally, the correction coefficients for the zones of the inkjet head dies 100 are calculated relative to the calculated distances r using Expression 1 (step S26). The distances from the center 120a of the silicon wafer 120 and the correction coefficients in Zones 1 to 4 of the inkjet head die 100 of Die 4 and in Zones 1 and 2 of the inkjet head die 100 of Die 5 are illustrated in FIG. 21.

In one embodiment, based on calculated correction coefficients, exposure masks that are closest to the correction coefficients are selected and used by zone during an exposure step of an actual manufacturing process. This sets the positions of the inflection points of the displacement profiles of piezo actuators 112 of each zone to correspond to in plane positions on silicon wafer 120, and thus makes the displacement amounts of piezo actuators 112 uniform.

Note that this embodiment derives the correction coefficients based on the assumption that the film thickness of piezoelectric film 142 and the displacement amount of piezo actuator 112 are proportionally related. The relationship between the thickness of piezo actuator 142 and the displacement amount of piezo actuator 112 is ascertained to more accurately correct the displacement amount.

Method for Manufacturing a Piezo Actuator Having a Ring Type Electrode

Figure 22:
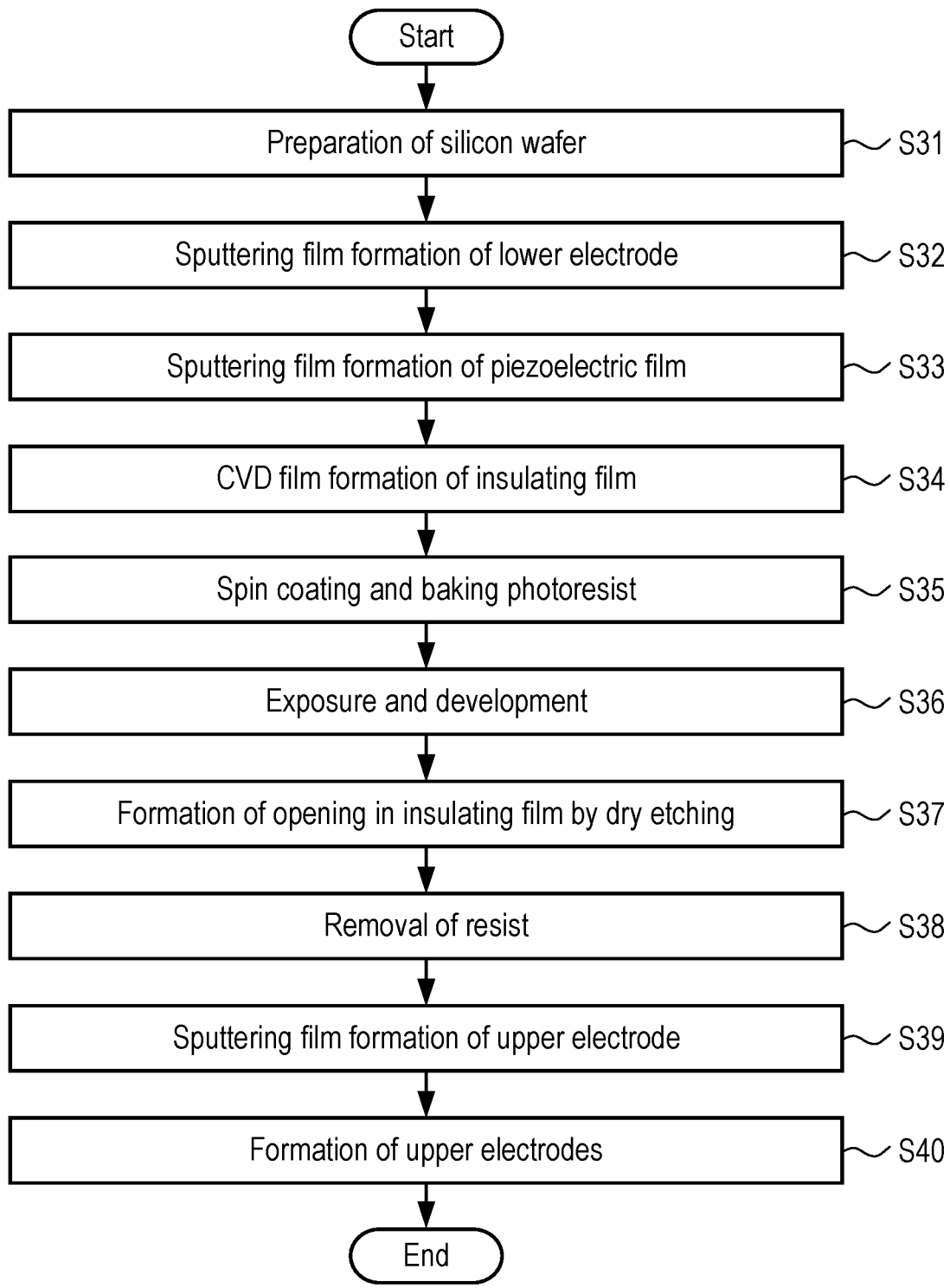
FIG. 22 is a flow chart illustrating one embodiment of a method for manufacturing a piezo actuator having a ring type electrode.

FIG. 22 illustrates another embodiment of a method for manufacturing a piezo actuator having a ring type electrode. As an example, FIGS. 23A-23I are used to illustrate the method for manufacturing piezo actuator 112.

Figure 23A:
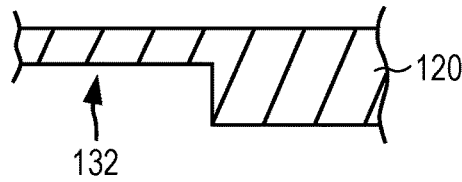
FIGS. 23A-23I are cross sectional views of a silicon wafer at each step of the manufacturing process for a piezo actuator having a ring type electrode.

Referring to FIG. 22, silicon wafer 120 is prepared by forming a plurality of pressure chambers 132 and an ink flow path that links the plurality of pressure chambers 132 on silicon wafer 120 through a pressure chamber forming step (step S31, see FIG. 23A).

Next, lower electrode 140 is formed as a film on silicon wafer 120 (step S32, an example of common electrode forming step). In one embodiment, this is performed by a sputtering method.

Figure 23B:
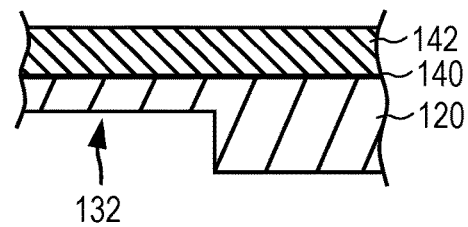

After forming lower electrode 140, piezoelectric film 142 is formed as a film on the side where lower electrode 140 of silicon wafer 120 has been formed as a film (step S33, an example of a piezoelectric body film forming step, see FIG. 23B). In one embodiment, this is performed by a sputtering method. In this manner, lower electrode 140 is formed on one surface of piezoelectric film 142.

Furthermore, as mentioned above, the film thickness distribution of piezoelectric film 142, which is at least partially the cause of the displacement amount distribution of piezo actuator 112, is generated in this sputtering film formation.

Figure 23C:
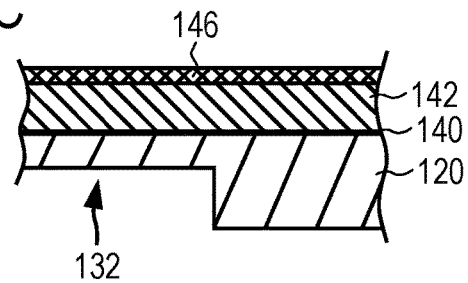

After forming piezoelectric film 142, insulating film 146 is formed as a film on the side where piezoelectric film 142 of silicon wafer 120 has been formed as a film (step S34, see FIG. 23C). Insulating film 146 may comprise, for example, SiN (silicon nitride), $SiO_2$ (silicon oxide). In alternative embodiments, insulating film 146 is formed by a Chemical Vapor Deposition (CVD) method or an Atomic Layer Deposition (ALD) method.

Figure 23D:
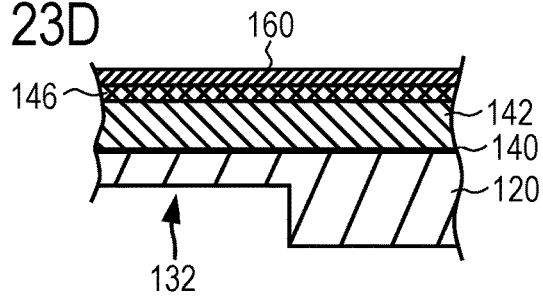
Figure 23E:
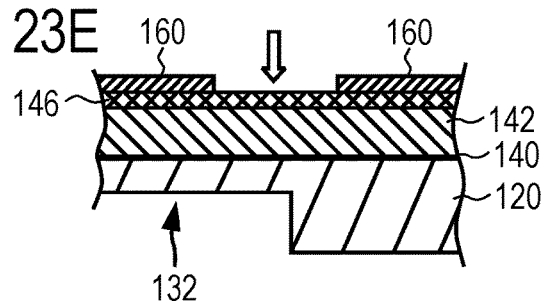
Figure 23F:
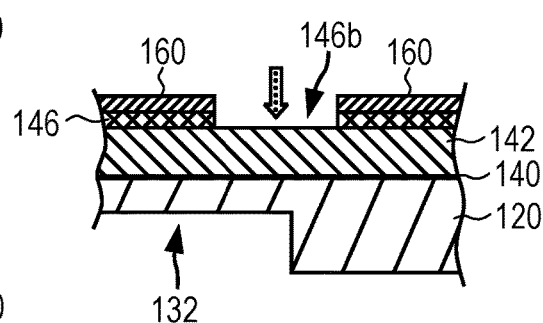
Figure 23G:
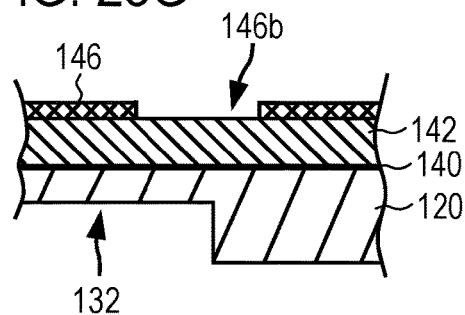
Figure 23H:
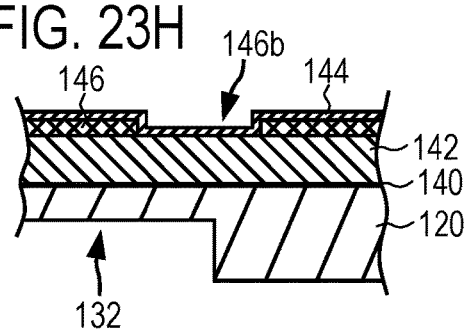
Figure 23I:
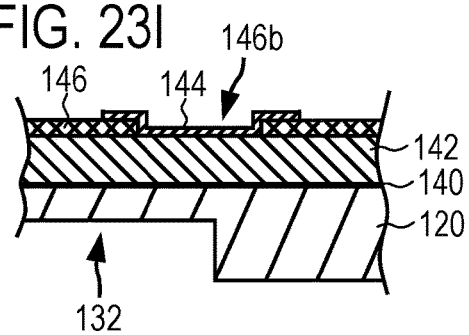

After forming insulating film 146, a photoresist 160 is applied (step S35, lithography process, see FIG. 23D). In one embodiment, photoresist 160 is applied by a spin coating method and baking is performed on the side where insulating film 146 of silicon wafer 120 has been formed as a film. Additionally, exposure (exposure step) and developing are performed to remove the region of opening 146b of insulating film 146 (step S36, see FIG. 23E).

Next, a ring-shaped opening 146b is formed in insulating film 146. In one embodiment, ring shaped opening 146b is formed by a dry etching method in accordance with an opening in photoresist 160 (step S37, an example of an insulating film forming step, see FIG. 23F), and then photoresist 160 is removed (step S38, see FIG. 23G).

After forming ring-shaped opening 146b, upper electrode 144 is formed as a film. In one embodiment, upper electrode 144 is formed by a sputtering method on the side where the insulating film 146 of the silicon wafer 120 has been formed as a film (an example of a surface opposite one surface of a piezoelectric body film) (step S39, see FIG. 23H). Then, just as with insulating film 146, a photoresist is applied, baking, exposure and developing are performed, a desired shape is formed by a dry etching method, and the resist is removed to form a plurality of upper electrodes 144 that correspond to the plurality of pressure chambers 132, respectively (step S40, an example of an individual electrode forming step, see FIG. 23I).

After performing the method of FIG. 22, piezo actuator 112 is produced. As for piezo actuator 112, upper electrode 144 substantially functions as a ring type electrode with an electrode width x, and this electrode width x is determined based on the width of opening 146b of insulating film 146. The width of opening 146b is determined in the exposure step for the photoresist 160 in step S6. By selecting and using the desired exposure mask from among a plurality of exposure masks by zone for inkjet head dies 100 (an example of an inflection point setting step, and an example of a mask selecting step) in the exposure step, the width of opening 146b is given a desired width. This sets the positions of the inflection points of the displacement profiles of piezo actuators 112 in desired positions, and makes the displacement amounts of piezo actuators 112 uniform.

Accordingly, in one embodiment, as for inkjet head die 100 (an example of an integrated circuit) where the plurality of piezo actuators 112 have been formed, the positions of the inflection points of the displacement profiles of the plurality of piezo actuators 112 are set in positions in at least one zone, which is one exposure region by stepper exposure, in positions that are different from other zones.

Note that the method for manufacturing inkjet head 200 is configured of the pressure chamber forming step described above and the piezoelectric element forming step for forming the plurality of piezo actuators 112 to correspond to the plurality of pressure chambers, respectively, using the method for manufacturing piezo actuators shown in steps S31 to S40. Furthermore, a die that forms a plurality of the nozzles 130 is overlapped to correspond to the plurality of pressure chambers 132.

In one embodiment, lower electrode 140, piezoelectric film 142, and then upper electrode 144 are laminated on the element forming surface of silicon wafer 120 in order to form piezo actuator 112; however, in another embodiment, the order of in which they are laminated is upper electrode 144, piezoelectric film 142, and then lower electrode 140.

Device Application Examples

In the embodiments described above, examples that applied to an inkjet recording device for graphic printing are described; however, the scope of application of the present invention is not limited to these examples. For example, the techniques described herein can be applied broadly to ink jet devices for drawing a variety of shapes and patterns using liquid functional materials such as wire drawing devices for drawing the wire patterns of electronic circuits, devices for manufacturing all types of devices, resist recording devices that use resin solutions as functional liquids for discharge, devices for manufacturing color filters, and microstructure forming devices for forming microstructures using materials for material deposition.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A method for manufacturing a piezoelectric element, the method comprises:
   forming a common electrode on a substrate
   forming a piezoelectric film on the common electrode;
   forming a plurality of individual electrodes on the other surface of the piezoelectric body film, at least two individual electrodes of the plurality of individual electrodes have different sizes to cause their associated piezoelectric film to have a uniform displacement amount when a voltage is applied to the at least two individual electrodes.

2. The method defined in claim 1 wherein each of the at least two individual electrodes is a ring-shaped electrode.

3. The method defined in claim 2 wherein the at least two individual electrodes comprise ring electrodes of different ring widths.

4. The method defined in claim 1 wherein electrodes in a first group of individual electrodes of the plurality of individual electrodes have a first width and electrodes in a second group of electrodes of the plurality of individual electrodes have a second width of a plurality of electrodes, wherein the first and second widths are different.

5. The method defined in claim 1 wherein the displacement amount is in a direction opposite to a corresponding pressure chamber.

6. The method defined in claim 1 wherein the electrode is electrically coupled to the piezoelectric body and has a portion that is located over a pressure chamber that is formed by at least part of the substrate, and wherein an amount of overlap of the electrodes of two or more of the plurality of jets having different sizes is different, such that at least one of the two or more jets of the plurality of jets has an individual electrode that is over more of its associated pressure chamber than the individual electrode of another jet of the two more jets is over its associated pressure chamber.

7. The method defined in claim 1 further comprising setting inflection points of displacement profiles of a plurality of piezoelectric elements that correspond to the plurality of individual electrodes by setting positions of the inflection points in positions that correspond to in plane positions of the plurality of piezoelectric elements on the substrate, where the piezoelectric element is made up of the common electrode, the piezoelectric body film, and the individual electrodes.

8. The method defined in claim 7 wherein forming a plurality of individual electrodes comprises forming the individual electrodes to be ring shaped with a ring width set based on an inflection point, wherein the ring with is the length in a width direction orthogonal to a circumferential direction of the ring shape to a width that corresponds to an in plane position on the substrate.

9. The method defined in claim 7 further comprising:
   forming an insulating film, where an insulating film is between the piezoelectric body film and the corresponding individual electrode, and electrically connects the piezoelectric body film and the individual electrode through an opening having a ring shape, and wherein
   setting an inflection point sets a ring width, which is the length in a width direction orthogonal to a circumferential direction of the ring shape, to a width that corresponds to an in-plane position on the substrate.

10. The method defined in claim 7 further comprising:
    forming an inflection point adjusting layer on the opposite side of the piezoelectric body film of the individual electrode, wherein inflection point setting sets an overlap amount between the individual electrode and the inflection point adjusting layer to an overlap amount that corresponds to an in-plane position on the substrate.

11. The method defined in claim 7 wherein setting an inflection point includes selecting a desired exposure mask from among a plurality of exposure masks, and setting positions of inflection points of displacement profiles of the plurality of piezoelectric elements in positions that correspond respectively to in-plane positions on the substrate.

12. The method defined in claim 7 wherein the substrate is divided into a plurality of dies and each die is given a plurality of exposure regions through a stepper exposure, and wherein setting the inflection point selects the desired exposure mask for each exposure region.

13. The method defined in claim 12 wherein setting the inflection point selects the desired exposure mask to correspond to a precalculated correction coefficient.

14. The method defined in claim 13 further comprising calculating the correction coefficients for each in plane position on the substrate.

15. The method defined in claim 14 wherein calculating a correction coefficient includes measuring displacement amounts for the plurality of piezoelectric elements for each in-plane position on the substrate, normalizing the displacement amounts of the plurality of piezoelectric elements to create normalized values, and then calculating reciprocals of the normalized values as the correction coefficients.

16. The method defined in claim 14 wherein calculating a correction coefficient includes measuring the film thickness of a piezoelectric body film of each distance from an in-plane reference point of the substrate, normalizing the film thickness of the piezoelectric body film of each distance to create normalized values, and then calculating reciprocals of the normalized values as correction coefficients.

17. The method defined in claim 16 wherein the reference point is a center of the substrate.

18. The method defined in claim 7 wherein forming a piezoelectric body film comprises laminating the piezoelectric body film by a sputtering method.

19. A method for manufacturing an inkjet head, comprising:
    forming a plurality of pressure chambers and a flow path that links the plurality of pressure chambers in the substrate; and
    forming a plurality of piezoelectric elements that correspond to the plurality of pressure chambers, respectively, using the method for manufacturing a piezoelectric element that comprises
    forming a common electrode on a substrate forming a piezoelectric film on the common electrode;

forming a plurality of individual electrodes on the other surface of the piezoelectric body film, at least two individual electrodes of the plurality of individual electrodes have different sizes to cause their associated piezoelectric film to have a uniform displacement amount when a voltage is applied to the at least two individual electrodes.

20. The method defined in claim 19, wherein the piezoelectric element is displacement driven in a convex manner in a reverse direction of the corresponding pressure chamber.

* * * * *